United States Patent
Saito et al.

(10) Patent No.: US 7,964,803 B2
(45) Date of Patent: Jun. 21, 2011

(54) MAGNETIC SHIELD STRUCTURE HAVING OPENINGS AND A MAGNETIC MATERIAL FRAME THEREFOR

(75) Inventors: Takeshi Saito, Tokyo (JP); Masanori Karikomi, Yamato (JP); Masanori Niwa, Kawasaki (JP); Hiroshi Ishikawa, Hachiouji (JP); Satoru Miura, Yokohama (JP); Masahiro Fujikura, Kunitachi (JP); Akira Sakaida, Yachiyo (JP); Yoneo Yamada, Tokyo (JP); Kentaro Chikuma, Aichi-ken (JP)

(73) Assignees: Nippon Steel Corporation, Tokyo (JP); Nippon Steel Engineering Co., Ltd., Tokyo (JP); Kajima Corporation, Tokyo (JP)

( * ) Notice: Subject to any disclaimer, the term of this patent is extended or adjusted under 35 U.S.C. 154(b) by 1064 days.

(21) Appl. No.: 10/549,069

(22) PCT Filed: Mar. 16, 2004

(86) PCT No.: PCT/JP2004/003457
§ 371 (c)(1),
(2), (4) Date: Nov. 24, 2006

(87) PCT Pub. No.: WO2004/084603
PCT Pub. Date: Sep. 30, 2004

(65) Prior Publication Data
US 2007/0272369 A1    Nov. 29, 2007

(30) Foreign Application Priority Data
Mar. 17, 2003   (JP) .................... 2003-071147
Mar. 17, 2003   (JP) .................... 2003-072119
Aug. 1, 2003    (JP) .................... 2003-205427

(51) Int. Cl.
H05K 9/00    (2006.01)

(52) U.S. Cl. ............... 174/391; 174/392; 335/301
(58) Field of Classification Search .......... 174/350, 174/377, 391, 392; 361/816, 818; 335/301
See application file for complete search history.

(56) References Cited

U.S. PATENT DOCUMENTS
3,982,058 A * 9/1976 Hill .................... 174/2
4,646,046 A * 2/1987 Vavrek et al. ......... 335/301

FOREIGN PATENT DOCUMENTS
JP   43-023267 B   10/1968
(Continued)

OTHER PUBLICATIONS
International Preliminary Report on Patentability, International Bureau, PCT/JP2004/003457, 8 pages (unnumbered).

*Primary Examiner* — Hung V Ngo
(74) *Attorney, Agent, or Firm* — Iandiorio Teska & Coleman

(57) ABSTRACT

A magnetic shield structure having openings, the structure comprising a plurality of similar magnetic blind bodies 2, each blind body 2 having an imaginary blind core plane F and a plurality of magnetic material slats 1 being spaced from each other by a distance d required for magnetic shielding, each slat 1 intersecting the blind core plane F at a longitudinal central axis C thereof, the longitudinal central axes of the slats are oriented substantially in parallel to each other on the blind core plane F. The blind bodies 2a, 2b are coupled in a row by serially coupling each slat 1 in each blind body 2a to a corresponding slat 1 of adjacent blind body 2b through overlapping or abutting of slat terminal portions, whereby the blind core planes Fa, Fb of the blind bodies 2a, 2b are so coupled as to define a successive magnetic shield plane, and spaces d between adjacent slats 1 in each blind body 2a, 2b form openings in the magnetic shield structure. Preferably, three or more magnetic blind bodies 2 are coupled in a row so as to form a closed magnetic path. The blind bodies 2a, 2b may be stacked side by side in such a manner that the blind core plane Fa, Fb are parallel to each other and orientation of the slat central axes in each blind body 2a, 2b being selected so as to optimize attenuation of magnetic field across the magnetic shield structure.

9 Claims, 19 Drawing Sheets

FOREIGN PATENT DOCUMENTS

| | | |
|---|---|---|
| JP | 1276797 A | 11/1989 |
| JP | 4094198 A | 3/1992 |
| JP | 4323267 A | 11/1992 |
| JP | 9162585 A | 6/1997 |
| JP | 11243295 A | 9/1999 |
| JP | 2002-164686 A | 6/2002 |

* cited by examiner (A)

(B)

(C)

(A)

2or3or20

(B)

(A) Magnetic Field Distribution of Coil Alone (B) Magnetic Field Distribution With Closed Type Shield Wall (C) Magnetic Field Distribution With Open Type Shield Wall (A)

(B)

MAGNETIC SHIELD STRUCTURE HAVING OPENINGS AND A MAGNETIC MATERIAL FRAME THEREFOR

TECHNICAL FIELD

This invention relates to a magnetic shield structure having openings, and more particularly to a magnetic shield structure which shields magnetic field while allowing passage of air and light therethrough.

BACKGROUND OF THE INVENTION

Urban electric stations handling large DC currents, such as major substations of railway system, are required to have active magnetic shield for preventing emanation of excessively strong magnetic field into environment due to large DC currents flowing therein. On the other hand, houses located close to electric railway tracks or feeders supplying currents thereto are required to have passive magnetic shield for preventing outdoor magnetic noise from entering indoors, so as to maintain the inside of the houses clean. The outdoor or environmental magnetic noise is due to currents of the railway tracks or feeders. In recent years, various machines using strong magnetic field are installed indoors, for instance MRI (Magnetic Resonance Imaging) equipment in medical facilities within office buildings. In case of indoor machines with strong magnetic field, both active and passive shields are simultaneously required. The reason for it is in that outdoor persons and equipment must be protected from undesirable effects of the strong indoor magnetic field, such as those of MRI, and at the same time, the indoor machines themselves must be protected from environmental magnetic noise so as to ensure their proper performance.

With a typical conventional method for active magnetic shield, a space containing a magnetic flux generating source to be shielded is tightly enclosed by plates of magnetic material with a high permeability $\mu$ (hereinafter, magnetic material with a high permeability $\mu$ is referred to as simply "magnetic material") so as to confine the magnetic flux therein. For instance, Patent Literature No. 1, which concerns a railway substation feeding DC power through feeding cables and return cables, discloses a magnetic shielding method by installing certain parts of the feeding cables and return cables side by side, so as to cancel the magnetic fluxes due to currents in said certain parts of the feeding and return cables with each other, while enclosing a required portion of the remaining parts of the cables by a duct made of magnetic material plates so as to suppress the magnetic flux density outside the duct due to the currents in said portion of the cables. In case of medical facilities using an MRI apparatus, undesirable effects of the MRI apparatus on the surrounding environment, such as nearby persons carrying heart pulse pace makers and nearby medical instruments, must be prevented. To this end, magnetic shielding is provided to a room housing MRI apparatus (MRI room), for instance by applying magnetic material plates to a portion or entire span of the sidewalls, ceiling and floor so as to maintain the magnetic flux density outside the MRI room at 0.5 mT or below.

In case of conventional passive magnetic shield, it is also typical to enclose tightly a space to be shielded with magnetic material plates so as to prevent outside magnetic flux from entering the space. For instance, a certain room in office building where office automation (OA) instruments are installed (OA room) has its slabs and sidewalls covered by magnetic material plates, so that magnetic noise or magnetic flux generated outside the OA room, indoors or outdoors, is prevented from entering into the OA room. In principle, the OA room may be shielded at six surfaces, four sidewalls and ceiling and floor. If, however, shielding against downstairs power source alone is necessary, a limited degree of protection can be provided by applying magnetic material plates only to selected floor areas, such as OA room floor. Patent Literatures No. 2 and No. 3 disclose techniques for improving the effectiveness of magnetic shield by using multiple layers of magnetic material plates or by filling joints of magnetic material plates with fillers made of specific magnetic material. Patent Literature No. 4 discloses a method of preventing magnetic flux leakage from openings of magnetic shield room by forming a closed magnetic path along the edge of such opening by using electromagnetic steel sheets.

[Patent Literature No. 1]
Laid-open Japanese Patent Publication No. 2001-231161
[Patent Literature No. 2]
Laid-open Japanese Patent Publication No. 1993-327263
[Patent Literature No. 3]
Laid-open Japanese Patent Publication No. 1995-273484
[Patent Literature No. 4]
Laid-open Japanese Patent Publication No. 1996-264350
[Patent Literature No. 5]
Laid-open Japanese Patent Publication No. 1996-288688
[Patent Literature No. 6]
Laid-open Japanese Patent Publication No. 2002-164686

DISCLOSURE OF INVENTION

Technical Problem to be Solved by the Invention

Most conventional magnetic shielding methods, either active or passive, are based on a structure in which peripheral walls of the space being shielded are covered by magnetic material plates parallel thereto (to be sometimes called as "tightly closed type" shielding), and air and light cannot pass through the shielded peripheral walls. Despite the use of such tightly closed type shielding, it has been difficult to achieve the high level protection required on the walls surrounding MRI, OA or other similar apparatuses, as anticipated from the performance of the magnetic material plate per se. For instance, if the cable duct formed of magnetic material plates, as proposed by Patent Literature No. 1, is fabricated on the principle of "tightly closed type" shielding without any openings except the cable passages, the inside of the duct may become very hot in summer and may cause insulation deterioration on the cables therein. In case of MRI room and OA room, "tightly closed type" shielding on the ceiling or sidewall may hamper conventional design of air-conditioning systems. Patent Literature No. 5 proposes a magnetic shield unit of ventilative type for use in clean rooms, but this literature fails to show how effective the proposed magnetic shield unit is. In view of the fact that this literature is based on conventional shield theory (paragraph 0009 and FIGS. 9 and 10), the effectiveness of the proposed magnetic shield unit may be safely assumed to be of conventional level. Besides, the structure of Patent Literature No. 5 requires a combination of filter frame and shield packing between adjacent magnetic shield HEPA filters, which combination tends to make the shield unit complicated and costly.

On the other hand, the inventors have developed a novel method for magnetic shielding and disclosed it in Patent Literature No. 6. In the novel method for magnetic shielding, a plurality of magnetic material slats are aligned in a manner similar to that of stacking of slats in a blind or louver, and a ratio of the product of the cross-sectional area (Sm) of the magnetic material slat and the relative permeability ($\mu_s$) of the slat (Sm·μ$_s$) to the cross-sectional area (Sa) of the gap between adjacent slats is selected to be larger than unity {(Sm·μ$_s$)/Sa>1}, whereby an attenuation of magnetic flux density is produced between the opposite surfaces of the aligned blind-like or louver-like slats. With these blind-like or louver-like alignment of magnetic material slats (to be referred to as "magnetic blind body" or "magnetic blind" or "blind", hereafter; may also be called to as "magnetic louver body"), one can obtain a magnetic shield structure which has openings for passage of air and light and yet also has substantially the same magnetic shield as that of the "tightly closed type" shielding. Besides, to obtain the same shielding effect as that of the "tightly closed type" shielding, one can expect that the magnetic blind may provide a more economical and effective design of a magnetic shield structure.

Recently, magnetic instruments to measure human body by using superconductive sensor technology, such as SQUID (Superconducting Quantum Interference Device) have been used at medical facilities. In semiconductor industries, devices sensitive to weak magnetic field, such an electron beam exposure device, have been developed. To facilitate construction of rooms for installing such SQUID or sensitive devices, there is a demand for a magnetic shield structure which renders high degree magnetic shield and yet allows passage of air and light therethrough. If the magnetic blind can render high degree of magnetic shield, then it may be used to build a magnetic shield structure that meets the above demand at a low cost.

Therefore, an object of the present invention is to provide a magnetic shield structure having openings and a magnetic material frames for building such structure, which shield structure renders high-grade magnetic shield while allowing passage of air and light.

Technical Solution of the Invention

At first, the inventors conducted experiments for confirming the effectiveness of a row of magnetic blinds, which consisted of a plurality of blinds coupled in a row (sometimes called as "lengthways coupled blinds row 16", hereinafter), with respect to magnetic field in a certain direction. Referring to FIG. 1(A), eight magnetic material slats 1 (made of grain-oriented electrical steel sheet and having a length direction aligned with easily magnetizable direction of grains in the sheet), each slat having a thickness 0.35 mm, a width 25 mm, and a length 300 mm, were overlapped one over another in the direction of thickness thereof with a gap d=30 mm between adjacent slats in the same direction, so as to form a blind 2a. Two more blinds 2b and 2c were formed in the same way as the first blind 2a. The three blinds 2a, 2b and 2c were coupled in a row by serially coupling corresponding slats 1 of the blinds, so as to produce a lengthways coupled blinds row 16 of sideways U-shape (with an inside volume of 280 mm×280 mm×280 mm), as shown in FIG. 1(B). In the lengthways coupled blinds row 16 of FIG. 1(B), serially adjacent slats 1 of blinds 2 were coupled by abutting terminal edges thereof. Another lengthways coupled blinds row 16 of U-shape (with an inside volume of 280 mm×280 mm×280 mm) as shown in FIG. 1(C) was produced in the same manner as that of the first such blinds row 16 of FIG. 1(B), except that serially adjacent slats 1 were coupled by overlapping the facing terminal portions 5 thereof (see FIG. 4(A)). For comparison, three 280 mm×280 mm square magnetic material shield plates 20a, 20b and 20c (to be called "solid shield plate(s)", hereinafter) of thickness 0.35 mm were prepared by using grain-oriented electrical steel sheets so as to produce the "tightly closed type" magnetic shield unit 21 of sideways U-shape as shown in FIG. 1(D). The weight of magnetic materials used in the "tightly closed type" magnetic shield unit 21 (to be sometimes called "solid shield unit 21", hereinafter) was substantially the same as that in the lengthways coupled blinds row 16 of FIG. 1(B) and FIG. 1(C).

Each of the three shield body specimens, namely two lengthways coupled blinds row 16 of FIG. 1(B) and FIG. 1(C) and the solid shield unit 21 of FIG. 1(D), was successively placed at the center of a loop coil L (such as a Helmholtz coil) of FIG. 15(A), while placing the blind 2a of the lengthways coupled blinds row 16 or the solid shield plate 20a of the solid shield unit 21 in parallel with the plane of the coil L. An AC current was applied to the coil L in a direction as shown by the arrow I of FIG. 15(A), so as to generate a magnetic field penetrating through the central portion of the blind 2a of the blinds row 16 or the solid shield plate 20a of the solid shield unit 21, in a direction as shown by the arrow M. A magnetic sensor 9 (e.g., a Gauss meter) was placed inside the specimen as shown in FIG. 15(A). Based on the measured magnetic flux density B in terms of μT, a shield coefficient S was calculated for each of the specimens 16 and 21 by using the following ratio in equation (1). Table 1 shows examples of the results of the experiments in terms of values of shield coefficient S thus measured and calculated. In the experiments, the current in the loop coil L was 0.1 A.

$$S = \frac{\text{Magnetic flux density } B_0 \text{ without shielding}}{\text{Magnetic flux density } B \text{ after shielded}} \quad (1)$$

One can see from the experimental outcome of Table 1 that the lengthways coupled blinds row 16 of FIG. 1(B) made by of three blinds 2a, 2b, 2c showed shielding effect (to be called "shield performance", hereinafter) comparable with the solid shield unit 21 of FIG. 1(D) made of three solid shield plates 20a, 20b, 20c, and that the lengthways coupled blinds row 16 of FIG. 1(C) made by overlapping the portion 5 of corresponding slats 1 of lengthways adjacent blinds 2 showed higher shield performance than that of the solid shield unit 21 of FIG. 1(D). The lengthways coupled blinds row 16 can be applied to an object of almost any shape to be shielded. The inventors repeated similar tests by applying the lengthways coupled blinds row 16 onto various surfaces to be shielded and measured values of the shield coefficient S. As a result, it was found that, in comparison with conventional solid shield unit 21, the lengthways coupled blinds row 16 can provide higher shield performance while using about the same amount of magnetic materials. Similar finding with respect to DC magnetic field M was confirmed by applying DC currents to the coil L of FIG. 15(A).

TABLE 1

| Type of Shielding structure | | Shield Coefficient S |
|---|---|---|
| Lengthways coupled blinds row, abutted | FIG. 1(B) | 1.8 |
| Lengthways coupled blinds row, overlapped | FIG. 1(C) | 2.2 |
| Tightly closed type shield structure | FIG. 1(D) | 1.8 |

Next, the inventors noted improved magnetic shield performance is obtainable by stacking the magnetic blinds 2 side by side, and carried out further series of experiments to check how the shield performance of the blinds 2 for uniformly oriented magnetic field varies in response to the stacking. In the tests, four blinds 2 were made by using PC Permalloy, and they were serially coupled into a lengthways coupled blinds row 16, as shown in FIG. 3(A). Further, four other blinds 2 were made by the same material, and each of the separately made four blinds 2 was sideways stacked with each side blind 2 of the lengthways coupled blinds row 16 of FIG. 3(A), i.e. right side blind 2, front side blind 2, left side blind 2 and back side blind 2, respectively. FIG. 8(C) shows one of side blind 2 (shown as 2b) of the lengthways coupled blinds row 16 of FIG. 3(A) after separately made blind 2 (shown as 2a) in sideways stacked thereto. In FIG. 8(C), the blind core plane Fa of the first blind 2a and the blind core plane Fb of the second blind 2b are disposed in parallel with each other, and the slats 1 of the two stacked blinds 2a, 2b are oriented in different directions, i.e. vertical in the blind 2a and horizontal in the blind 2b as shown in FIG. 8(C). The lengthways coupled blinds row 16, either as shown in FIG. 3(A) or after second blind 2 being stacked thereto as shown in FIG. 8(C), was placed at the central portion of the loop coil L of FIG. 15(A) while placing one blind 2 thereof in parallel with the plane of the coil L. A magnetic filed M of flux density 100 μT at the center of the coil L was produced as shown in FIG. 15(A) by applying a suitable AC current thereto as indicated by the arrow I. The magnetic sensor 9 was placed inside the blinds row 16, and variation of the flux density B was measured by the sensor 9. The above-mentioned shield coefficient S of the blinds row 16 was calculated based on the measured flux density B, for cases with single layered blind 2 without second blind (see FIG. 3(A)) and double layered blinds 2 with second blind (see FIG. 8(C)). Table 2 shows the result of such experiments and calculation.

TABLE 2

| Item No. | Number of layers | Slat Orientation | | Shield Coefficient S |
|---|---|---|---|---|
| | | Inner layer | Outer layer | |
| 1 | 1 | — | Horizontal | 11 |
| 2 | | — | Vertical | 11 |
| 3 | | Horizontal | — | 12 |
| 4 | | Vertical | — | 12 |
| 5 | 2 | Horizontal | Horizontal | 22 |
| 6 | | Vertical | Vertical | 22 |
| 7 | | Vertical | Horizontal | 27 |
| 8 | | Horizontal | Vertical | 27 |

In Table 2, the column "inner layer" refers to that blind 2 which is located closer to the sensor 9 than "outer layer". The word "vertical" in Table 2 means that the orientation of longitudinal central axis C of the slat 1 in the blind 2 is vertical (see FIG. 8(A)), while "horizontal" means that the orientation of longitudinal central axis C of the slat 1 in the blind 2 is horizontal (see FIG. 8(B)). One can see from Table 2 that, as compared a lengthways coupled row 16 with single layered blind 2, the similar row 16 double layered blinds 2 has a considerably improved shield performance. Compare Item Nos. 1-4 of Table 2 with Item Nos. 5-8 of Table 2. Further, with the double layered blinds 2, the shield performance is considerably affected by the orientation of the slats 1 in each blind 2 (Compare Item Nos. 5, 6 with Item Nos. 7, 8 of Table 2.). Whereas, with the single layered blind 2, the shield performance is not materially affected by the orientation of the slats 1 (See Item Nos. 1-4 of Table 2.).

The inventors have repeated the experiments on the shield coefficient S of the double layered blinds 2 of FIG. 8(C) (sometime called as "sideways coupled blinds unit 3" or "stacked unit 3", hereinafter) while varying the orientations of the slats 1 in the inner and outer blind layers, and have found that the shield coefficient S of the unit 3 can be optimized or maximized for a given magnetic field M, by selecting suitable number of layers of blind 2 to be stacked and suitable slat orientation in each layer of blind 2 (See Item Nos. 7, 8 of Table 2.). The inventors confirmed similar findings with respect to DC magnetic field M. Namely, for a given magnetic field to be shielded, one can build suitable magnetic shield structure having openings and suitable shield performance by coupling and/or stacking the above blinds 2 in rows and/or layers. The invention has been completed as the result of further experiments and development based on the above findings.

From one aspect, as shown in FIG. 1, a magnetic shield structure having openings according to the invention comprises a plurality of similar magnetic blind bodies 2, each blind body 2 having an imaginary blind core plane F and a plurality of magnetic material slats 1 being spaced from each other by a distance d required for magnetic shielding, each slat 1 intersecting the blind core plane F at a longitudinal central axis C (see FIG. 1(A)) thereof, and the longitudinal central axes C of the slats 1 are oriented substantially in parallel to each other on the blind core plane F. The blind bodies 2 are coupled in a row by serially coupling each slat 1 in each blind body 2 to a corresponding slat 1 of adjacent blind body 2 through overlapping or abutting of slat terminal portions, whereby the blind core planes F of the blind bodies 2 are so coupled as to define a successive magnetic shield plane (see Fa+Fb+Fc in FIG. 1), and spaces d between adjacent slats 1 in each blind body 2 form openings in the magnetic shield structure. Preferably, as shown in FIG. 3(A), three or more (four in FIG. 3(A)) magnetic blind bodies 2 are coupled in a row so as to form a closed magnetic path.

From the other aspect of the invention, as shown in FIG. 8, a magnetic shield structure according to the invention comprises a plurality of the magnetic blind bodies 2 being stacked side by side in such manner that blind core planes F of sideways adjacent blind bodies 2 being parallel to each other, and orientation of longitudinal central axis C of the slat 1 in each blind body 2 being selected so as to optimize attenuation of magnetic field across the magnetic shield structure, and spaces between adjacent slats 1 in each blind body 2 form the openings in the magnetic shield structure. Preferably, orientation of longitudinal central axis C of the slat 1 in sideways adjacent blind bodies 2 are so selected as to cross each other. The inventors found that, the shield performance of the sideways stacked blinds unit 3 of two parallel magnetic blind bodies 2a, 2b can be maximized by selecting the orientations of slats 1 (namely, orientation of the longitudinal central axes C thereof) in the two blind bodies 2a, 2b so as to cross each other, as shown in Items No. 7 and 8 of Table 2. The inventors also found that insertion of an air gap 4 between the two blind bodies 2a, 2b in the sideways stacked blinds unit 3 may contribute to the improvement of shield performance of the unit.

Referring to FIGS. 9 and 10, a plurality of similarly sideways stacked blinds unit 3A, 3B are coupled in a row by serially coupling each slat 1 of corresponding blind bodies 2 in adjacent stacked units 3 through overlapping or abutting of slat terminal portions. Desirably, three or more sideways stacked blinds unit 3 are coupled in a closed row so as to form a closed magnetic path, as suggested in FIG. 11.

Further, referring to FIG. 2, a magnetic shield structure such as the lengthways coupled blinds row 16 can be fabricated by overlaying a number of magnetic material frames 6. A magnetic material frame 6 for magnetic shield structure of the invention comprises a plurality of either planar magnetic material slats 1 or laminated magnetic material slats 1 (formed by lamination of a number of thin magnetic material sheets 18 one over the other, see FIG. 7) coupled substantially on the same plane as that of the slat itself and in a row 16 by aligning the slats 1 in a row, while juxtaposing longitudinal terminal edges thereof and coupling facing terminal portions of adjacent slats 1 through overlapping or edge-to-edge abutting. Preferably, each magnetic material frame 6 is formed by serially coupling three or more separately prepared slats 1 into a closed row, so as to provide a closed magnetic path. More preferably, the slat 1 is made of laminated construction and is provided with at least one such patterned terminal edge surface having protrusions and indents in the longitudinal direction thereof, so that a plurality of such slats 1 can be coupled in a row by serially coupling the adjacent slats through snug engagement of the patterned terminal edges thereof. In a preferred form of the slat 1, depth R of the indent on its terminal edge as taken from tip of the protrusion is not smaller than one tenth of the width W of the slat terminal edge (R≧0.1 W).

A plurality of the magnetic material frames 6, as shown in FIG. 2, 4 or 6, may be overlapped one over another in the normal direction of each frame 6 at a given inter-slat distance d, so as to form a magnetic shield structure having openings as shown in FIG. 1(B), 1(C) or 3(A). Referring to FIG. 3(A) in particular, the inside space of such magnetic shield structure formed by overlapping the frames 6 may be a cable duct or a magnetically shielded space.

ADVANTAGEOUS EFFECTS OF THE INVENTION

A magnetic shield structure according to the invention can exert the following outstanding effects, because the structure comprises lengthways coupled or sideways stacked magnetic blinds and has openings formed of inter-slat spaces of the blinds.

(1) A structure rendering magnetic shield performance equivalent to or stronger than conventional tightly closed type shield unit while allowing passage of air and light is provided.
(2) Magnetic blinds in the above structure can couple each other without leaking flux so as to strengthen shield performance.
(3) Magnetic shield performance equivalent to that of prior art can be obtained with less magnetic materials than prior art.
(4) Magnetic shielding can be locally strengthened by sideways stacking of magnetic blinds so as to form stacked units.
(5) Magnetic shield performance can be further improved by inserting an air gap layer between stacked layers of magnetic blinds.
(6) Magnetic shield combined with air passage enables use of air-conditioner with shielding and prevention of thermal decay of inside the enclosed inner material.
(7) Magnetic shield combined with visibility provides for easier maintenance and control of equipment and patient-friendly care.
(8) In response to change of magnetic noise source as time elapses, the magnetic shielding can be easily and economically modified.
(9) Magnetic shield of conventional level can be provided with less material, at a lighter weight and lower cost than before.

BEST MODE OF CARRYING OUT THE INVENTION

FIG. 1(A) shows examples 2a, 2b and 2c of magnetic blind 2 to be used in the shield structure of the invention. Each blind 2 is made by overlapping a necessary number of slats 1 or an elongated narrow plate made of magnetic material with a necessary inter-slat distance d by a fixing framework or support member (not shown), while placing longitudinal central axes C (See FIG. 8a-8c) on a common blind core plane F (Fa, Fb, Fc) substantially in parallel to each other. The central axis C of the slat 1 may be a curve, so as to make the blind core plane F curved. The inter-slat distance d of the blind 2 can be selected depending on the required shield performance. For instance, a ratio of the product of the cross-sectional area Sm (=W·t, W being slat terminal portion width and t being slat thickness) of the slat 1 and the relative permeability $\mu_s$ of the slat (Sm·$\mu_s$) to the cross-sectional area Sa (=W·d) of the gap between adjacent slats is selected to be larger than unity {(Sm·$\mu_s$)/Sa>1}, whereby an attenuation of magnetic flux density is produced between the opposite surface of the aligned slats 1 of the blind 2. The distance d need not be uniform throughout the blind 2, and it can vary depending on position of individual slats 1 in the blind 2. In fact, at positions facing an opening or door, the distance d can be made wider while increasing the cross-sectional area of the slat 1 larger (thicker). It is sufficient for the slat 1 to have its central axis C on the blind core plane F, and the angular position about the central axis C may vary from slat to slat.

Referring to two types of the embodiment shown in FIG. 1(B) and (C), a row of the blinds 2 such as a lengthways coupled blinds row 16 can be formed by lengthways coupling a plurality of blinds 2a, 2b by serially coupling corresponding slats 1 of adjacent blinds 2 through overlapping or abutting of terminal portions thereof. One or more lengthways coupled blinds rows 16 may be used to build a magnetic shield structure, by disposing the blinds row(s) 16 so as to face a magnetic field to be shielded. With the magnetic shield structure thus built, the inter-slat distance d in each blind 2a, 2b allow free passage of air and light therethrough, and yet the serial coupling of slats 1 in a row by overlapping or abutting of the terminal portions of the slats 1 being coupled provides magnetic continuity between the blinds 2a, 2b thus coupled. Whereby, leakage of magnetic flux at the coupling between adjacent blinds 2a, 2b in such blinds row 16 can be suppressed low. Thus, with the magnetic shield structure of the invention, the effective area of magnetic field allowing passage of air and light can be expanded, for instance simply by lengthways coupling of a number of blinds 2a, 2b. In the illustrated examples, the inter-slat distances d1, d2 of the blinds 2a, 2b are the same, but they may vary from blind to blind under certain conditions. For instance, the inter-slat distance d2 of the blind 2b may be m (m being an integer not smaller than 2) times as large as the inter-slat distance d1 of the blind 2a, and the slat 1 of the blind 2b may be coupled to every $m^{th}$ slat of the blind 2a.

To find a most suitable method for coupling terminal portions of corresponding slats 1 of adjacent blinds 2 in a straight row, the inventors carried out experiments. For the experiments, specimens of
(a) a blind 2 using slats 1 each being a unitary solid sheet as shown in FIG. 5(A),
(b) a blind 2 using slats 1 each having two short plates which are coupled by abutting terminal edges thereof as shown in FIG. 5(B),
(c) a blind 2 using slats 1 each having two short plates which are coupled through planar contact by overlapping of terminal portions thereof as shown in FIG. 5(C), and
(d) a blind 2 using slats 1 each having two short plates which are coupled by abutting terminal edges thereof and overlaying a magnetic material bridging plate 8a across the abutted terminal edges as shown in FIG. 5(D), were made, respectively, and the above-mentioned shield coefficient S of each specimen was measured by placing each specimen at the central portion of the loop coil L of FIG. 15(A). As a result, it was found that, as compared with the measured coefficient S value of the specimen of the blind in FIG. 5(A), the measure value of the coefficient S was reduced to 31% in the specimen of FIG. 5(B), to 97% in the specimen of FIG. 5(C), and to 83% in the specimen of FIG. 5(D).

To look into a most suitable method for coupling terminal portions of corresponding slats 1 of mutually crossing blinds 2, the inventors carried out experiments. For such experiments, specimens of (e) a row of blinds 2 in which corresponding slats 1 of adjacent blinds are coupled through planar contact by overlapping the crossing portions thereof as shown in FIG. 5(E), (f) a row of blinds 2 in which corresponding slats 1 of adjacent blinds are coupled through planar contact by overlapping the crossing portions thereof while inserting a non-magnetic member 8b, e.g., an acrylic resin plate as shown in FIG. 5(F), (g) a row of blinds 2 in which corresponding slats 1 of adjacent blinds are coupled by abutting one slat's terminal edge to the other slat's sidewall as shown in FIG. 5(G), and (h) a row of blinds 2 in which corresponding slats 1 of adjacent blinds are coupled by abutting one slat's terminal edge to the other slat's sidewall and overlaying a magnetic material bridging plate 8a across the abutted edge-sidewall portions as shown in FIG. 5(H)

were made, respectively, and the above-mentioned shield coefficient S of each specimen was measured by placing each specimen at the central portion of the loop coil L of FIG. 15(A). As a result, it was found that, as compared with the measured coefficient S value of the specimen of the row of blinds 2 in FIG. 5(E) which was the largest, the measure value of the coefficient S was reduced to 67% in the specimen of FIG. 5(F), to 26% in the specimen of FIG. 5(G), and to 77% in the specimen of FIG. 5(H).

As can be understood from the experimental results, referring to FIG. 2(B), the connection of blinds 2 by coupling corresponding slats 1 thereof through planar contact, i.e., through overlapping of terminal portions thereof, can suppress the flux leakage at the coupled portion of blinds 2 and can improve the shield performance of the lengthways coupled blinds row 16. If, however, magnetic continuity at the coupled terminal ends of slats 1 is ensured, one can expect that the lengthways coupled blinds row 16 formed by abutting slat terminal edges (see FIG. 1(B)) can produce shield performance comparable with that of "tightly closed type" shield structure, as described above by referring to Table 1. Thus, if high-grade magnetic shield performance is not required, satisfactory magnetic shield performance of coupled portion may be obtained by abutting terminal edges, or edge-sidewall abutting, of the corresponding slats 1 of adjacent blinds 2 as shown in FIG. 2(A). In this case, deterioration of shield performance will be suppressed by overlaying a magnetic material bridging plate 8a across the abutted terminal edges of slats 1.

FIGS. 2(A) through 2(D) show examples of magnetic material frame 6 prepared by overlapping or abutting of longitudinal end portions of regular or shortened slats 1 substantially on the same plane as that of the slat itself, which frame 6 may be used to form a lengthways coupled blinds row 16. In fact, a lengthways coupled blinds row 16 of FIGS. 1(B) and 1(C) may be produced by overlaying the magnetic material frames 6 of FIGS. 2(A)-2(D) in the normal direction of the frame at a required inter-frame distance d.

The lengthways coupled blinds row 16 can be applied to almost any arbitrary surface to be shielded in a space to be magnetically shielded. It is noted here that the shield performance of the lengthways coupled blinds row 16 can be greatly increased by arranging the blinds row 16 so as to form a closed magnetic path which surrounds a space to be shielded. FIG. 3(A) illustrates an example of such lengthways coupled blinds row 16 which forms a closed magnetic path.

The lengthways coupled blinds row 16 of FIG. 3(A) which forms a closed magnetic path may be built by overlay a plurality of annular magnetic material frames 6 of FIG. 4 one over another in the normal direction (i.e. slat thickness direction) thereof at an inter-frame distance d. FIG. 4(A) shows an example of the annular magnetic material frame 6 prepared by lengthways coupling four magnetic slats 1 through overlapping of one-end terminal portion 5 of a slat 1 on the opposite-end terminal portion 5 of its adjacent slat 1. The shape of the annular magnetic material frame 6 can be triangular as shown in FIG. 4(B), or hexagonal as shown in FIG. 4(C), or polygonal with seven or more sides. The annular or polygonal magnetic material frame 6 may sometimes be referred to as "annular magnetic material plate 6" or "annular frame 6" herein.

What is important in the magnetic material frame 6 made of slats 1 is to couple the slats 1 substantially on the same plane as that of the slat 1 per se. The magnetic circuit (i.e. magnetic path) of each frame 6 is preferably of closed shape, but it can be of easily closable shape such a partially open U-shape as shown in FIGS. 2(A)-2(D). The shape of the slat 1 is not restricted to rectangle, but can be of any form suitable for use in combination with others. For instance, referring to FIG. 23(A), one or more U-shaped slats 1u can be used in conjunction with I-shaped slats 1i, so as to form a closed magnetic path(s). The slat 1 can be of C-shape or L-shape or any other shape suitable for independent use or for use in combination with other slats 1 to form a frame 6 with a closed magnetic path. Once a frame(s) 6 with a closed magnetic path(s) is(are) formed, a magnetic shield structure having openings can be produced simply by overlapping the frames 6 in normal direction thereof at a suitable inter-frame distance d, so as to facilitate low-cost production.

To check the shield performance of the lengthways coupled blinds row 16 which form a closed magnetic path, a lengthways coupled blinds row 16 (with an inside volume of 280 mm×280 mm×280 mm) as shown in FIG. 3(A) was formed by coupling the four blinds 2 through overlapping of terminal portions thereof so as to form a planar closed magnetic path. Each blinds 2 were made by overlaying eight slats 1 (made of grain-oriented electrical steel sheets), each being 0.35 mm thick, 25 mm wide and 300 mm long with an inter-slat distance d=30 m. For comparison, the "tightly closed type" magnetic shield unit 22 of cubic shape as shown in FIG. 3(B) (to be sometimes called "solid shield unit 22", hereinafter) was made by using four solid shield plates 20 each being 0.35 mm thick, 280 mm wide and 280 mm long. The weight of magnetic material used in the blinds row 16 of FIG. 3(A) was substantially the same as that in the solid shield unit 22 of FIG. 3(B). The shield coefficient S of the blinds row 16 and the solid shield unit 22 thus made was measured, by placing each of them at a time in the proximity of the center of the loop coil L of FIG. 15(A). In the measurement, a unidirectional DC magnetic field M of 5-200 µT was produced at the central portion of the loop coil L, and the magnetic flux density B after shielded was measured by placing a magnetic sensor 9 at the central portion of the blinds row 16 or the solid shield unit 22. The results of the experiments are shown in Table 3 and FIG. 16. The abscissa of the graph of FIG. 16 shows magnetic flux density $\mu_0H_0(=B_0)$ before being shielded, and the ordinate shows the shield coefficient S of the blinds row 16 (the invention) and the solid shield unit 22 (the reference) thus measured.

The experimental results of Table 3 and FIG. 16 show that, as long as the shield performance with respect to unidirectional DC magnetic field M of 5-200 µT is concerned, the lengthways coupled blinds row 16 having the planar closed magnetic path was 2-3 times more effective than the solid shield unit 22. Detailed theory for such high shield performance of blinds row 16 is not known yet, however, it seems that the planar closed magnetic path formed by lengthways coupling of magnetic material slats 1 of blinds 2 forms such annular shape which surrounds a space to be shielded, that the annular planar magnetic path thus formed tends to accumulate the magnetic flux of the space into said annular planar magnetic path per se, and that the magnetic flux leakage through said annular planar magnetic path is drastically reduced. The above-referred high shield performance appears to be due to the enclosing of the space to be shielded by said annular planar magnetic path having drastically reduced magnetic flux leakage. It is also noted that the amount of magnetic material to achieve a required degree of shield performance can be reduced by using the lengthways coupled blinds row 16 having the annular planar magnetic path for enclosing the space to be shielded, as compared with the similar amount required by the use of the solid shield unit 22. Hence, the invention enables building of a high-degree magnetic shield structure economically and efficiently.

TABLE 3

| Preshield magnetic flux density $B_0$ | 10 µT | 50 µT | 100 µT |
|---|---|---|---|
| Shield coefficient S of lengthways coupled blind row having a planar closed magnetic path (FIG. 3A) | 4.7 | 7.4 | 8.3 |
| Shield coefficient S of tightly closed type magnetic shield unit (FIG. 3B) | 2.3 | 2.5 | 2.6 |

FIG. 8 shows another embodiment of the invention. A sideways stacked blinds unit 3 (see FIG. 8(C)) is formed by sideways stacking a plurality of blinds 2a, 2b such as those of FIGS. 8(A) and 8(B) while disposing the blind core planes Fa, Fb thereof substantially in parallel to each other. The sideways stacked blinds unit 3 can be used as a magnetic shield structure for a space to be shielded, and in this case the blind core planes Fa, Fb face the magnetic field M (see FIGS. 1(B)-(D)) of the space. As a feature of the stacked unit 3, the shield performance can be controlled by selecting the number of blinds 2 (i.e. the number of blind layers) stacked therein and selecting the orientation of slat 1 in each blind 2. In the illustrated embodiment, the blind 2a with vertical slats 1 and the blind 2b with horizontal slats 1 are arranged sideways, so that the orientation of the longitudinal central axes C of the slats 1 (slat orientation) in the blind 2a is perpendicular to that of the blind 2b. In the invention, the slat orientations in the two individual blinds 2a and 2b to be sideways stacked are not restricted to be perpendicular to each other, and the slat orientations in two or more individual blinds 2 can be, for instance, parallel to each other or cross with each other at a suitable angle. In the examples of Items 5-8 of Table 2, the shield performance of sideways stacked blinds unit 3 was improved by selecting a combination of perpendicular slat orientations for the two blinds 2a and 2b. If the required level of shield performance is low, another combination of slat orientations such as parallel slat orientations may be used in adjacent slats 2a and 2b. Preferably, best slat orientations in individual blinds 2a, 2b and the like can be determined beforehand by experiments or computer calculation so as to optimize or maximize the shield performance relative to specific magnetic field M to be shielded.

The illustrated sideways stacked blinds unit 3 per se may be applied to an arbitrary shieldable plane in a space to be magnetically shielded. If, however, a large shielding surface is required to shield a given broad magnetic field M, the shielding surface of the sideways stacked blinds unit 3 of FIG. 8(C) can be expanded by coupling a number of such units 3 in a manner similar to the method of forming the above-mentioned lengthways coupled blinds row 16. More specifically, a plurality of the illustrated sideways stacked blinds units 3 each having a comparatively small shielding surface may be coupled together through overlapping or edge-to-edge abutting of terminal portions of corresponding slats in adjacent sideways stacked blinds units 3 so as to produce an enlarged version of the sideways stacked blinds unit 3 having a broad shielding surface. FIG. 9 shows an embodiment of combination of two sideways stacked blinds units 3, namely stacked unit 3A including a blind 2Aa having vertical slat orientation and another stacked unit 3B including a blind 2Ba having vertical slat orientation. The two sideways stacked blinds units 3A and 3B of FIG. 9 are coupled by serial magnetic coupling of the vertically oriented slats of the blinds 2Aa and 2Ba thereof through overlapping the terminal portions 5 thereof. Further, FIG. 10 shows another embodiment of combination of the stacked units 3, namely a first sideways stacked blinds unit 3A including a blind 2Ab having horizontal slat orientation and a second sideways stacked blinds unit 3B including a blind 2Bb having horizontal slat orientation. The slats of the blind 2Ab are on the same planes as those of the corresponding slats of the blind 2Bb, respectively, and the two blinds 2Ab and 2Bb in the two stacked units 3A and 3B have mutually crossing blind core planes FAb and FBb, and hence, the slat orientations of the two blinds 2Ab and 2Bb cross with each other on a common horizontal plane. The two sideways stacked blinds units 3A and 3B of FIG. 10 are coupled in a crossing manner by serial magnetic coupling of the horizontally oriented slats of the blinds 2Ab and 2Bb thereof in crossing manner through overlapping the terminal portions 5 thereof. The embodiments of FIGS. 9 and 10 show that, for a magnetic field M with a large surface area to be shielded, a magnetic shield structure can be provided by using an enlarged version of sideways stacked blinds unit 3 equipped with shield performance capable of meeting the required need. It is noted that, in the enlarged version of the sideways stacked blinds unit 3, the inter-slat distance d for those blinds which are to be linearly coupled (e.g., 2Aa and 2Ba of FIGS. 9 and 2Ab and 2Bb of FIG. 10) must agree between adjacent sideways stacked blinds units 3, but the inter-slat distance d for those slats which are not to be linearly coupled need not be the same between adjacent sideways stacked blinds units 3.

Referring to FIGS. 3(A), 4(A)-4(C) and 11, it is possible to couple serially three or more sideways stacked blinds units 3 by serial coupling of corresponding slats of adjacent stacked units 3, so as to form a closed magnetic path surrounding a space to be shielded. With such a closed magnetic path, the magnetic shield performance of the magnetic shield structure having openings can be further improved.

As a feature of the invention, the shield performance of each magnetic shield structure using the sideways stacked blinds unit 3 can be controlled by modifying the number of layers of blinds 2 in such stacked unit 3, in addition to the above control by modification of the slat orientation in the individual blinds 2a, 2b. The inventors conducted experiments by making specimens of sideways stacked blinds unit 3 each having magnetic blinds 2 (formed of PC Permalloy slats 1) in three layers, i.e., an inner layer, a middle layer, and an outer layer; modifying the slat orientations in the three layered blinds; and measuring the shield coefficient S of the specimens by placing each specimen at the central portion of the loop coil L of FIG. 15(A). The results of the experiments are shown in Items 15-18 of Table 4. By comparing Items 15-18 of Table 4 with Items 5-8 of Table 2, one can understand that the shield performance of the sideways stacked blinds unit 3 can be improved by increasing the number of layers of blind 2 therein, and that the shield performance increases when the slat orientations in different blind layers cross each other at right angles or at a certain angle. As compared with the case of shielding units with single blind 2 layer (see Items 1-4 of Table 2), the shielding unit with three stacked layers of blinds having mutually crossing slat orientations (at right angles or at other angles) improves shield coefficient S by a factor 4-5. Namely, with the magnetic shield structure of the invention, synergistic effects of improvement by a combination of (i) increase in the number of blind layers and (ii) crossing of blind orientations in adjacent blind layers are effectively utilized.

TABLE 4

| Item No. | Number of layers | Slat Orientation | | | Shield Coefficient S |
|---|---|---|---|---|---|
| | | Inner layer | Middle layer | Outer layer | |
| 11 | 2 | Horizontal | (air gap) | Horizontal | 37 |
| 12 | | Vertical | (air gap) | Vertical | 37 |
| 13 | | Horizontal | (air gap) | Vertical | 42 |
| 14 | | Vertical | (air gap) | Horizontal | 43 |
| 15 | 3 | Horizontal | Horizontal | Horizontal | 45 |
| 16 | | Vertical | Vertical | Vertical | 46 |
| 17 | | Horizontal | Vertical | Horizontal | 59 |
| 18 | | Vertical | Horizontal | Vertical | 59 |

The inventors found by experiments that with three-layered sideways stacked blinds unit 3, shield performance of that blinds unit 3 can be improved by inserting, for instance, an air gap layer 4 between adjacent blind layers 2. The inventors made specimens of sideways stacked blinds unit 3 having an air gap layer 4 between two blind layers 2 (formed of PC Permalloy slats 1) as shown in FIG. 8(D), and the shield coefficient S of the specimens was measured by placing each specimen at the central portion of the loop-coil L of FIG. 15(A). The results of the experiments are show in Items 11-14 of Table 4. As can be seen from comparison of Items 11-14 of Table 4 and Items 4-8 of Table 2, shield performance can be improved by inserting an air gap layer 4 between of blind layers 2. Such improvement of the shield performance by the air gap layer 4 enables betterment of the shield structure without increasing the amount of the magnetic materials used, such as the number of slats 1, in the structure. In other words, to obtain the same level of shield performance, the amount of magnetic material may be reduced to facilitate cost cut down.

Therefore, the purpose the invention, i.e., provision of a magnetic shield structure having openings and a magnetic material frames for building such structure, which shield structure renders high-grade magnetic shield while allowing passage of air and light, is fulfilled.

Embodiment 1

The shield performance of the magnetic shield structure of the invention can be controlled by a number of factors; such as the space between slat terminal edges to be abutted or between a slat terminal edge and a slat sidewall to be abutted, gap G between slat terminal portions 5 (FIG. 2(B)) to be overlapped (namely, the gap between two magnetic plates which are overlapped, taken in the thickness direction of the plate overlapped), the magnitude of the overlapped area α, the kind of magnetic material, and the number of blind layers to be stacked in a sideways stacked blinds unit 3. It is also possible to adjust the shield performance by modifying the shape of terminal edges of slats 1 to be abutted together. For instance, the terminal edge of slat 1 to be abutted may be cut with an angle 45° relative to the longitudinal central axis C, so as to facilitate abutting of the thus cut terminal edges.

[Experiment 1]

To check the relationship between the space in the abutted slat terminal edges and shield performance obtained by using the abutted slat terminal edges, six specimens of lengthways coupled blinds rows 16 as shown in FIG. 1(B) were made by serially coupling corresponding slats 1 of three blinds 2 through terminal edge abutting, each blind 2 having eight slats 1 (grain-oriented electrical steel sheet with a length direction aligned with the rolling direction of steel), each slat 1 having a thickness 0.35 mm, a width 25 mm, and a length 300 mm, the eight slats 1 being overlaid one over another with an inter-slat gap d=30 mm. Six specimens had abutting spaces of different magnitudes in the range of 0-5 mm in the terminal edge, respectively. The shield coefficient S of each specimen of the lengthways coupled blinds row 16 thus made was measured by placing each specimen at the central portion of the loop coil L of FIG. 15(A), producing a unidirectional DC magnetic field M in the central portion of the coil L, and measuring the magnetic flux density B by a magnetic sensor 9 disposed inside the enclosed inner space of the lengthways coupled blinds row 16 of each specimen while driving the coil L by a current in the direction of the arrow I, so as to calculate the shield coefficient S based on the measured value of the magnetic flux density B. The experimental results are shown in FIG. 17. In the graph of FIG. 17, the abscissa shows the abutting space, and the ordinate shows the shield coefficient S measured. The experimental results teach that the shield performance decreases with the increase of the abutting space, but it was confirmed that with an abutting space of not greater than 3 mm, significant shield coefficient can be achieved. More specifically, in making the lengthways coupled blinds row 16 by using terminal edge abutting with an abutting space, such abutting space should preferably be not greater than 3 mm.

[Experiment 2]

To check the relationship between the gap G in the overlapped terminal portions of slats 1, taken in the overlapping direction, and shield performance obtained by using the overlapped slat terminal portions, nine specimens of lengthways coupled blinds rows 16 as shown in FIG. 3(A) were made by serially coupling corresponding slats 1 of four blinds 2 through overlapping of terminal portions, each of which blinds 2 was the same as that of Experiment 1. In each specimen of the lengthways coupled blinds row 16, overlapping gaps G of different magnitudes were formed in a range of 0-5 mm, varying from specimen to specimen. The shield coefficient S of each specimen of the lengthways coupled blinds row 16 thus made was measured by placing the specimen at the central portion of the loop coil L of FIG. 15(A), producing a unidirectional DC magnetic field M of 100 μT in the central portion of the coil L, and measuring the magnetic flux density B by a magnetic sensor 9 disposed inside the enclosed inner space of the blinds row 16. The experimental results are shown in Table 5 and FIG. 18.

TABLE 5

| | Overlapping Gap (mm) | | | | | | | | |
|---|---|---|---|---|---|---|---|---|---|
| | 0 | 0.1 | 0.2 | 0.5 | 1 | 2 | 3 | 4 | 5 |
| Shield Coefficient S | 8.5 | 8.5 | 8.3 | 8.0 | 7.9 | 7.0 | 4.7 | 3.5 | 3.3 |

Comparison of Table 5 and Table 3, even with an overlapping gap G of 5 mm, a shield performance higher than that of the solid shield unit 22 can be obtained. Table 5 and FIG. 18, however, indicate that the shield performance deteriorates with the increase of the overlapping gap G, and the shield performance rapidly deteriorates when the gap G exceeds 3 mm. Therefore, with the overlapped terminal portions of slats 1 for the lengthways coupled blinds row 16, the overlapping gap G should preferably be kept 3 mm or less.

[Experiment 3]

A plurality of lengthways coupled blinds rows 16 as shown in FIG. 3(A) were made by using blinds 2, each being prepared by overlaying eight slats 1 (grain-oriented electrical steel sheet), each slat 1 having a thickness 0.35 mm, a width 25 mm, and a length 900 mm, the eight slats 1 being overlaid one over another with an inter-slat gap d=30 mm, and the shield coefficient S of each blinds rows 16 was measured in the similar manner to that of Experiment 2. In Experiment 2, the length E of each row of slats (the length of each closed magnetic path) was 1200 mm (300×4), and the corresponding length E of this Experiment was 3600 mm (900×4). In each blinds row 16, overlapping gaps G of different magnitudes was formed in a range of 0-5 mm, as in Experiment 2. The experimental results are shown in FIG. 19 along with the results of Experiment 2. In the graph of FIG. 19, the abscissa shows ratio between the length E of each row of slats and the overlapping gaps G (=G/E), and the ordinate shows the shield coefficient S measured. The circle o indicates the result of Experiment 2, and a cross x indicates the result of this Experiment. The Experimental result of the figure teaches that when the ratio of the overlapping gap G to the length E of each row of slats is 0.0025 or less, good shield performance was achieved. Hence, when lengthways coupled blinds row 16 is made by overlapping terminal portions of slats 1, the ratio of the overlapping gap G to the length E of each row of slats should preferably be kept 0.0025 or less (G≦0.0025×E).

[Experiment 4]

To check the relationship between the overlapped area α of overlapped terminal portions 5 of slats 1 and shield performance obtained by using the overlapped area, specimens of lengthways coupled blinds rows 16 as shown in FIG. 3(A) were made by four of the same blinds as those of Experiment 2 while using that slats coupling by overlapping of terminal portions of the slats through various areas α at each coupling, and the shield coefficient S of each specimen was measured. The experimental results are shown in Table 6 and FIG. 20. In the graph of FIG. 20, the abscissa shows ratio between the square of slat terminal portion width ($W^2$), the width W being 25 mm, and the overlapped area α of the terminal portions 5 (=α/$W^2$, to be called as "overlap area ratio", hereinafter), and the ordinate shows the shield coefficient S measured. Table 6 shows that with the lengthways coupled blinds rows 16 having closed magnetic paths, comparatively high shield performance can be achieved even if the overlap area ratio is null (=0) (namely, abutting of terminal edges of slats 1). Table 6 and FIG. 20, however, indicate that the shield performance deteriorates when the overlap area ratio is smaller than (0.1-0.2). Therefore, when lengthways coupled blinds row 16 is made by overlapping terminal portions of slats 1, it is preferable to keep the overlap area ratio at 0.1 or larger ($\geqq 0.1W^2$), more preferably 0.2 or larger ($\geqq 0.2W^2$)

TABLE 6

| | Overlap Area Ratio | | | | | | |
|---|---|---|---|---|---|---|---|
| | 0 | 0.1 | 0.2 | 0.4 | 0.6 | 0.8 | 1.0 |
| Shield Coefficient S | 4.7 | 6.0 | 7.9 | 8.0 | 8.3 | 8.5 | 8.5 |

Embodiment 2

The shield performance of the magnetic shield structure of the invention can be controlled by modifying the number of overlapped surfaces of corresponding slats 1 to be used in a lengthways coupled blinds row 16 or a sideways stacked blinds unit 3. For instance, referring to FIG. 2(C), in case of an edge-to-sidewall coupling of slats 1 reinforced by a magnetic material bridging plate 8a covering one side surface of the abutted portions, if that coupling is further supplemented by a second bridging plate 8a applied to the opposite surface of the abutted portions, then the number of overlapped surfaces can be increased by sandwiching the abutted portion at the opposite surfaces thereof. Further, in case of coupling two slats 1, if each slat 1 is a laminated plate made by lamination of a number of thin magnetic material sheets 18 (see FIGS. 6 and 7), then the thin sheets 18 of one slat 1 may be overlapped on the thin sheets 18 of the other slat 1 one over another, so as to increase the number of overlapped surfaces.

[Experiment 5]

To check the change in shield performance due to increase of the number of overlapped surfaces, with four slats 1 (1a, 1b, 1c, 1d and so on) each having three thin magnetic material sheets 18 (grain-oriented electrical steel sheet with a thickness 0.35 mm, a width 25 mm, and a length 300 mm) laminated therein, three kinds of annular magnetic material plates (annular frames) 6a, 6b, 6c were prepared by coupling four such slats 1a, 1b, 1c, 1d so as to form a magnetic closed path. FIG. 6(A) is a side view of the annular frame 6a, which has only one overlapped surface at each terminal portion of the slat 1 (number of overlapped surface=1). FIG. 6(B) shows a side view of the annular frame 6b, which has coupling made by overlapping of individual thin magnetic material sheets 18 (number of overlapped surfaces=5). FIG. 6(C) is a side view of the annular frame 6c, which has coupling made by abutting terminal portions. A first specimen 16a of a magnetic shield structure was made by overlaying eight annular frames 6a at an inter-frame distance d=30 mm, as shown in FIG. 3(A). Second and third specimens 16b, 16c of the magnetic shield structure were made in the similar manner to the first specimen 16a except that the eight annular frames 6a were replaced by eight annular frames 6b and 6c, respectively. Each of three specimens had inner volume of 280 m×280 m×280 m, respectively. For comparison, four laminated solid shield plates 20 were made by laminating three 280 mm×280 mm square thin magnetic material sheets 18, respectively, and a solid shield unit 22 was produced by using the four laminated solid shield plates 20 as shown in FIG. 3(B). The weight of the magnetic materials in the solid shield unit 22 thus produced was substantially the same as that in the above three specimens 16a, 16b and 16c using the annular frames of FIGS. 6(A) through 6(C).

The shield coefficient S of each specimen 16a, 16b and 16c thus made were measured by placing the specimen at the central portion of the loop coil L of FIG. 15(A), producing a unidirectional DC magnetic field of 5-200 μT in the central portion of the coil L, and measuring the magnetic flux density B by a magnetic sensor 9 disposed inside the enclosed inner space of each specimen. The experimental results are shown in Table 7 and FIG. 21.

TABLE 7

| | Preshield magnetic flux density $B_0$ | 10 μT | 50 μT | 100 μT |
|---|---|---|---|---|
| a. | Shield coefficient S, with Shield of FIG. 6A | 6.6 | 9.1 | 10.4 |
| b. | Shield coefficient S, with Shield of FIG. 6B | 7.9 | 10.9 | 11.7 |
| c. | Shield coefficient S, with Shield of FIG. 6C | 4.2 | 5.7 | 6.7 |
| ref. | Shield coefficient S of Tightly closed type shield unit | 2.7 | 3.1 | 3.2 |

In FIG. 21, the abscissa shows preshield (or before being shielded) magnetic flux density $\mu_0 H_0 (=B_0)$ and the ordinate shows the shield coefficient S of the specimens 16a, 16b, 16c and the solid shield unit 22 after being placed by the loop-coil L. Based on the comparison of Tables 7 and 3, it was confirmed that the use of laminated magnetic plate as slat 1 improves the shield performance, and that the shield performance can be further improved by increasing the number overlapping surfaces at the terminal portions of slat 1.

[Experiment 6]

FIG. 7 illustrates an embodiment of a laminated magnetic material slat 1 which has indents and protrusions on at least one terminal edge. FIGS. 7(A) and 7(B) show a slat 1 made by laminating six thin magnetic material sheets 18 in the thickness direction thereof. Adjacent three thin sheets 18 are longitudinally protruded or recessed as a group relative to the remaining thin sheets, so as to produce the indents and protrusions on one or both longitudinal terminal edge surface. The slats 1 of FIGS. 7(C) and 7(D) are made of eight thin magnetic material sheets 18, of which adjacent two sheets are manipulated as a unit to produce the projections and recesses structure on one or both terminal edges thereof. In the slat 1 of FIGS. 7(E) and 7(F), seven thin sheets magnetic material 18 are laminated and each individual sheet is manipulated to produce uneven terminal edge surface with protrusions and recesses. Any one of the slats 1 of FIGS. 7(A) through 7(F) can be coupled with a similarly shaped slat 1 by snag engagement of the uneven terminal edge surfaces so as to form an annular frame 6 of FIG. 4.

To achieve high-grade magnetic shield performance with the magnetic shield structure having openings, it is important to couple terminal portions of the slat 1 by overlapping with planar contact and to suppress flux leakage from the coupled portions through the planar contact. The coupling of two slats 1 by snug engagement of uneven edge surfaces thereof as shown in FIG. 7(G) can produce a large number of overlapping contact surfaces between adjacent slats 1 and more effectively minimizes the magnetic flux leakage thereat, as compared with the simple overlap-type coupling of FIG. 2(B). If the number of thin magnetic material sheets 18 is constant, the smaller the numbers of sheets to be manipulated as a group, the more number of overlapped surfaces are produced, and the smaller the magnetic flux leakage becomes. The number and shape of the protrusions and indents are not restricted to those illustrated. The inventors have found out through experiments that preferable depth R of the indent (the length of the protrusion from the edge portion of thin sheet 18) from tip of the protrusion is not smaller than one tenth of the slat terminal portion width W ($R \geq 0.1W$). If the indent depth R become less than one tenth of the slat terminal portion width W, the gap formed at the coupling portion cannot be neglected from the standpoint of magnetic flux leakage, and such magnetic flux leakage would amount to a significant magnitude.

Embodiment 3

In the foregoing, magnetic shield structure for unidirectional magnetic field M in a particular direction has been described in the main. In case of passive shield for a room wherein the direction of magnetic field M to be shielded is varying and not definite, a magnetic shield structure using the lengthways coupled blinds row 16 as shown in FIG. 3(A) seems effective as a "basic unit". The shield structure of FIG. 3(A), however, has a weakness in that the shield performance in the direction of overlaying the annular magnetic material plates 6 is ineffective or small. To deal with magnetic field of any direction, it is important to eliminate magnetic holes in the shield structure. According to the invention, the superposition of the basic unit as shown in FIGS. 11 and 12 would facilitate the building of a magnetic shield structure having openings capable dealing with magnetic field of any direction.

FIG. 12 shows an embodiment of magnetic shield structure of the invention using the basic unit of FIG. 3(A), in which a basic unit 7 consists of a plurality of annular magnetic material plates 6 lying on a plurality of substantially parallel planes P separated by a certain pitch d, which planes P cross an axis A with a certain angle, respectively, the axis A passing the center O of a space Q to be shielded, each plate 6 having a diameter not exceeding the boundary of the space Q on the plane P. This basic unit 7 corresponds to the lengthways coupled blinds row 16 of FIG. 3(A). An example of the annular magnetic material plate 6, as depicted in FIG. 4, consists of magnetic slats 1 magnetically coupled with each other by overlapping or abutting of terminal portions thereof so as to form a closed magnetic path. A plurality of basic units 7 in different axial directions A, such as three directions $A_1$, $A_2$, $A_3$, may be superposed to form an enclosing surface of the space Q, such as six walls including four sidewalls and top wall and bottom wall.

A method for building the magnetic shield structure of FIG. 12 will be explained by referring to FIG. 13. To begin with, a plurality of planes P crossing a first axis $A_1$ at right angles with a certain pitch $d_1$, the axis $A_1$ passing the center O of a space Q to be magnetically shielded, are considered. A set $7_1$ of first annular magnetic material plates $6_1$ are placed on the planes $P_1$, respectively. Each annular magnetic material plate $6_1$ has an outer diameter not exceeding the boundary of the apace Q on the plane $P_1$. Then, within the inside space of the set $7_1$ of first annular magnetic material plates $6_1$, a second axis $A_2$ passing the center O of the space Q and a plurality of planes $P_2$ crossing the axis $A_2$ at right angles are placed. A second set $7_2$ of second annular magnetic material plates $6_2$ are placed on the planes $P_2$. In short, in the periphery of the space Q to be shielded a set $7_1$ of first annular magnetic material plates $6_1$ are placed, and in the space within the set $7_1$ of first annular magnetic material plates $6_1$, a second set $7_2$ of second annular magnetic material plates $6_2$ are placed.

In the example of FIG. 13, the first annular magnetic material plates $6_1$ and second annular magnetic material plates $6_2$ are made rectangular, and the first axis $A_1$ and the second axis $A_2$ cross at right angles, so that on the ceiling and floor, two layers of blinds 2 are disposed with crossing slat orientations, while single layer of blinds 2 are disposed on the four sidewalls. Thereby, a magnetic shield structure having openings is built. If, however, the first axis $A_1$ and the second axis $A_2$ are selected to be parallel with each other, the magnetic shield structure will have two-layered blinds 2 along the ceiling, floor and two sidewalls. If the crossing angle of the planes $P_1$ and planes $P_2$ with the axes $A_1$ and $A_2$ are changed from the right angle to an arbitrary angle, the inclination of the blind 2 may be controlled at will. Thereby, in the magnetic shield structure of FIG. 12, the shield performance of the space Q in various directions can be controlled by selecting the orientations of the first axis and second axis $A_1$ and $A_2$, the crossing angles of the planes $P_1$ and $P_2$ with the axes $A_1$ and $A_2$, respectively.

Preferably, as shown in FIG. 13, within the vacant space in the second set $7_2$ of second annular magnetic material plates $6_2$, a third axis $A_3$ passing the center O of the space Q while crossing both the first and second axes $A_1$ and $A_2$ at right angles and a plurality of planes $P_3$ crossing the axis $A_3$ at right angles are placed. A third set $7_3$ of third annular magnetic material plates $6_3$ with outside diameters smaller than the inside diameters of the second annular magnetic material plates $6_2$ are placed on the planes $P_3$, respectively. With such arrangement, on six peripheral surfaces of the space Q to be shielded, i.e., four sidewalls, ceiling and floor are provided with two-layered blinds 2 with crossing slat orientation, and the shield performance as listed in Items 7-8 of Table 2 can be provided on all the six side peripheral surfaces of the space Q to be shielded. Further, if the gap layers 4 (FIG. 8(D)) are provided between the first set $7_1$ of first annular magnetic material plates $6_1$ and the second set $7_2$ of second annular magnetic material plates $6_2$, and also between the second set $7_2$ of second annular magnetic material plates $6_2$ and the third set $7_3$ of third annular magnetic material plates $6_3$, then the shield performance as shown in Items 13 and 14 of Table 4 can be applied to all the peripheral surfaces of the space Q in six directions.

Although the structure shown in FIGS. 12 and 13 is of three-layered telescopic type, it is also possible to consider a structure of $n^{th}$ order. In case of the $n^{th}$ order structure, an $n^{th}$ axis $A_n$ passing the center O of the space Q and a plurality of $n^{th}$ planes $P_n$ crossing the axis $A_n$ with a certain pitch $d_n$, for instance at right angle with uniform pitch, are placed within the inside space of the $(n-1)^{th}$ set $7_{n-1}$ of annular magnetic material plates $6_{n-1}$. The $n^{th}$ set $7_n$ of $n^{th}$ annular magnetic material plates $6_n$ may be place on the $n^{th}$ planes $P_n$, respectively, which $n^{th}$ plates $6_n$ having outer diameters smaller than those of the $(n-1)^{th}$ plates $6_{(n-1)}$. With such arrangement, the space Q to be shielded would have n layers of annular magnetic material plates 6, namely, from first set $7_1$ of annular plates $6_1$ to $n^{th}$ set $7_n$ of annular plates $6_n$.

In case of, for instance, rooms for such magnetic measurement relating to organism like human body which requires an extremely tight shield, about twenty layers of sets $7_n$ of annular plates $6_n$ of telescopic type may be provided.

FIG. 14 shows an embodiment of a space Q enclosed by a shield structure having openings of FIG. 13. The shield structure having openings according to the invention is featured in that high-grade shield performance is ensured while allowing passage of air and light as well as heat radiation therethrough. Each set 7 of annular plates 6 may be provided with ventilation draught 11, so that air passage from an air-conditioner compressor 12 to the space Q may be formed despite the multi-layered telescopic annular plates 6, so as to facilitate conventional design of air-conditioning and other environmental control means. Further, suitable heat insulations 10 may be disposed between adjacent annular plates 6, for instance as air gap layer 4, so as to build a magnetically shielded clean room of constant temperature type.

[Experiment 7]

The inventors have built a model magnetic shield structure having openings of three-layered telescopic type, as shown in FIG. 13, by using sets 7 of annular magnetic material plates 6 (see FIG. 4(A)) formed of slats 1 of PC Permalloy, which slats 1 were serially coupled through overlapping of terminal portions 5 thereof. The shield performance in terms of shield coefficient S of this model magnetic shield structure was measured by placing it at the central portion of the loop coil L of FIG. 15(A), disposing a magnetic sensor 9 inside the model magnetic shield structure, and generating a required magnetic field M with required magnetic flux density by feeding a DC or AC current in the coil L. Further, the solid shield unit 22 as shown in FIG. 3(B) was made by using the solid shield plates 20 made of PC Permalloy, and its shield performance was measured and compared with that of the shield structure having openings of the invention. The same weight of the magnetic material as used in the shield structure having openings of the invention was assigned for building the solid shield unit 22. The results of this Experiment are shown in Table 8.

TABLE 8

| | | Shield Coefficient S | | |
|---|---|---|---|---|
| | Magnetic Field Applied | Tightly | With | |
| Item No. | DC/AC | Magnetic Flux Density μTp-p | closed type (C) | opening type (O) | Performance Ratio (O/C) |
| 1 | DC | 1 | 13.0 | 62.3 | 4.8 |
| 2 | | 10 | 14.3 | 78.9 | 5.5 |
| 3 | | 100 | 17.4 | 139.5 | 8.0 |
| 4 | AC | 1 | 9.8 | 20.0 | 2.0 |
| 5 | | 10 | 10.0 | 21.8 | 2.2 |
| 6 | | 100 | 10.6 | 27.0 | 2.5 |

Based on the results of Table 8, it was confirmed that the shield structure having openings of three-layered telescopic type as shown in FIG. 13 revealed higher shield performance in both DC or AC magnetic field as compared with that of the solid shield unit 22 using the same weight of magnetic material as that of the shield structure of the invention. Especially, with respect to DC magnetic field, the shield performance of the shield structure of the invention showed 5-8 times as high performance as that of the solid shield unit 22. As the magnetic flux density increased, the difference in the shield performance between the structure having openings and the solid shield unit 22 increased. It was confirmed from the results of this Experiment that the shield structure having openings according to the invention revealed high magnetic shield at reasonable cost for magnetic field of high magnetic flux density, as compared with conventional "tightly closed type" shield structure.

Embodiment 4

The magnetic shield structure having openings according to the invention is expected to serve for not only passive shield but also for active shield. Further, the shield structure of the invention is expected to fulfill simultaneously both the active and passive shield performance. It is noted that rooms having instruments driven by strong magnetic field such as MRI or NMR (Nuclear Magnetic Resonance) are required to suppress the above-mentioned magnetic flux leakage, and at the same time are expected to produce a stable indoor magnetic field by eliminating influence from outdoor magnetic disturbances. With conventional tightly closed type single-layer shield, the magnetic materials for shielding purposes may sometimes be saturated by the indoor source of magnetic driving and may be made ineffective or insufficient in terms of shutting out the influence from strong outdoor magnetic disturbances. With the magnetic shield structure of the invention, it is possible to stack sideways a plurality of blinds, and the number of stacked layers of blinds can be increased or decreased depending on changes in magnetic environment. Inner blinds layer(s) of the stacked structure may be assigned for active shielding to suppress (shield) the influence from indoor, while assigning outer blinds layer(s) for passive suppress (shield) of the influence from outdoor, so as to ensure reliable performance of both active and passive magnetic shielding. More specifically, the shield structure of the invention is particularly useful for indoor room having strong magnetic machines like MRI in a city zone subject to powerful magnetic noises railways, power lines, electric stations and the like

[Experiment 8]

To confirm that the shield structure of the invention acts simultaneously for both passive shield and active shield, the inventors built a three-layered telescopic magnetic shield structure having openings as shown in FIG. 13 by using slats made of grain-oriented electrical steel sheets, placing the loop coil L in the central portion of the structure as shown in FIG. 15(B), generating DC magnetic field M by flowing a DC current in the coil L in the direction of the arrow I as similar to that of MRI, and measuring the magnetic flux leakage outside the structure by a magnetic sensor 9. By moving the sensor 9 to a number of spots outside the structure, the flux density in three axial directions at each spot was measured and the measured values were synthesized, and a map showing distribution of magnetic field strength outside the shield structure was prepared based on the synthesized values. By comparing similar map when the shield structure was not used, the active shield performance of the shield structure of the invention was studied. In addition, the solid shield unit 22 was made by using grain-oriented electrical steel solid shield plates in the same manner as that of Experiment 7, and a similar map magnetic showing distribution of magnetic field strength was prepared to compare the active shield performance of the solid shield unit 22 with that of the structure of the invention.

FIG. 22(A) is a map showing the distribution of magnetic flux density around the coil L when the magnetic shield structure was not installed. FIG. 22(B) is a map showing the distribution of magnetic flux density outside the solid shield unit 22. FIG. 22(C) is a map showing the distribution of magnetic flux density outside the magnetic shield unit having openings of the invention. FIG. 22(A) also shows the location where a shield structure (shield wall) was installed. As shown in FIG. 22(B), with the solid shield unit 22 alone, 0.20 mT of outdoor leakage magnetic flux remained near the wall, while as indicated in FIG. 22(C) the magnetic flux density near the wall was reduced to about 0.08 mT with the magnetic shield structure of the invention. It is noted that, there were magnetic flux leakage at the rectangular coupling of portions of the solid shield plates 20 with the solid shield unit 22 (see FIG. 22(B)), whereas there was not magnetic flux leakage with the coupled portion of the magnetic slats 1 in the structure of the invention (see FIG. 22(C)). As to the reasons for the difference in the magnetic flux leakage from the coupled portions, it is noted that the solid shield unit 22 had to use the abutting of the solid shield plates as indicated in FIGS. 5(B) and 5(I), while the shield structure having openings according to the invention used overlapping through planar contact type coupling as shown in FIGS. 5(A) and 5(E), MRI rooms in medical organizations are expected to suppress the outdoor leakage of magnetic flux to 0.5 mT or below, preferably about 0.1 mT, to avoid undesirable effects on outside persons carrying pace-makers or other outside medical instruments. The experimental results shown in FIG. 22 indicate that the shield structure having openings according to the invention has higher active shield performance than that of "tightly closed type" shield structure using the same weight of shielding material, and hence is suitable for magnetic shielding of MRI rooms and the like.

Embodiment 5

The shield performance of the magnetic shield structure having openings according to the invention may vary depending on the magnetic materials used. For achieving good shield performance, it is preferable to use soft magnetic materials with a high permeability $\mu$. Permeability of soft magnetic materials, however, varies depending on intensity of magnetic field, and magnetic field intensity that gives high permeability depends on the kind of soft magnetic materials. Hence, to ensure good performance over a wide range of magnetic field intensity, it is preferable to form the magnetic slat 1 by using one material or a combination of two or more materials selected from the group consisting of grain-oriented electrical steel sheet, non-oriented electrical steel sheet, Permalloy, soft magnetic steel sheets, amorphous alloy, and nanocrystalline materials crystallized from liquid-quenched thin strips.

The inventors also confirmed through experiments that good shield performance for high-level shielding can be obtained by using directional magnetic material (e.g., grain-oriented electrical steel sheet) having easily magnetizable direction that can be aligned with the direction of magnetic flux to be shielded. It is also possible to form a blind 2 having different kinds of slats 1 made of different materials, so as to facilitate the shield performance by combining such different kinds of slats 1 depending on the need of actual field to be shielded.

Embodiment 6

The magnetic shield structure having openings according to the invention is effective in preventing undesirable influence (disturbance on monitor images of OA (office automation) machines) caused by AC/DC magnetic filed due to electric currents in electrical wires, such as power cables and current-carrying wires, so as to maintain orderly magnetic environment around electrical wires. As heat generated in cable duct for electrical wires must be dissipated, supplementary cooling facilities become necessary if such duct is completely covered by "tightly closed type" shield structure. If the cable duct is made open-type by the magnetic shield structure having openings of the invention, need for additional cooling facilities with magnetic shield can be eliminated, and the duct can be kept simple and shield materials for additional magnetic shield can be saved. Further, in case of installing additional cable(s) for expansion of facilities, complicated process is necessary to strengthen the duct with conventional "tightly closed-type" duct. On the other hand, addition of cables can be handled very easily with the open-type duct of the invention.

FIG. 23(A) shows an example of such open-type magnetic shield cable duct for electrical wires. Annular magnetic material frames (annular frames) 6 are disposed so as to enclose electrical wires 24 on planes crossing the direction of the wires 24 at about right angles while keeping a proper spacing therefrom, so as to shield magnetically the space enclosed by the annular frames 6. The annular frames 6 of FIG. 23(A) act to surround the wires 24 with a magnetic shield structure similar to that of FIGS. 3(A) and 13. More specifically, each annular frame 6 of FIG. 23 has a pair of element slats 1u and 1i, namely a U-shaped magnetic material slat 1u similar to the frame 6 of FIGS. 2(A) through 2(D) and an I-shaped magnetic material slat 1i, and a closed magnetic path is formed by magnetic coupling of the element slats 1u and 1i. Magnetic coupling between the element slats 1u and 1i is made by overlapping or abutting thereof. Preferably, suitable coupling members of resilient type are attached to such coupling portions of the elements slats 1u and 1i, or the coupling portions of the elements slats 1u and 1i are made resilient, so that the coupled portions are kept in state contact with each other. An open-type magnetic shield duct as shown in FIG. 23(A) can be built by disposing the annular frames 6 in the length direction of the cable 24 to be enclosed thereby.

In the embodiment of FIG. 23(A), a wire rack 23 to support the wires 24 is placed in the space surrounded by the annular frames 6. As long as the wires 24 are properly supported by the annular frames 6 alone, however, an open-type cable duct for electrical wires can be formed by the annular frames 6 alone and the wire rack 23 can be dispensed with. The annular frame 6 for the cable duct is not restricted to the combination of elements slats 1u and 1i, and if the shield of lower-side of the duct alone is sufficient, the upper element slat 1i may be dispensed with. Referring to FIG. 23(B), the frame 6 for the open-type cable duct may be formed by four or three elements slats 1i of I shape.

Although the embodiment of FIG. 23 is intended to shield a source of magnetic field within the cable duct, in areas close to large power transmission lines and the like source of environmental magnetic field, houses and rooms may be shielded by enclosing them with a plurality of annular frames 6 in the same manner as that of this embodiment, so as to construct clean environment from outdoor magnetic disturbances.

INDUSTRIAL APPLICABILITY

The magnetic shield structure having openings of the invention can be used in a broad range of technical fields covering architecture, construction and others. For instance, it is useful in installations where strong magnetic field is used for MRI and the like medical equipment, superconducting sensors, accelerators in semiconductor factories and laboratories, strong magnetic field facilities for nuclear fusion, electron beam (EB) devices, electronic microscopes, nuclear magnetic resonance (NMR) devices, trunk power lines and transformers in power stations, rooms requiring passive and/or active magnetic shield like computer rooms and power source rooms, and other similar facilities. The magnetic shield structure of the invention can be used in combination with a large number of applications, such as sound barriers of railways, railroad slab, box culvert, rib of form, railway stations, feeder covers, magnetic shield for common ducts of underground power lines, and the like. The shield structure may be formed as functional parts of other equipment such as display cover, hybrid building structures such as acoustic/magnetic shield wall in combination with sound-absorbing material, heat-insulating/magnetic-shielding wall, and the like.

EXPLANATION OF SYMBOLS

Figure 1:
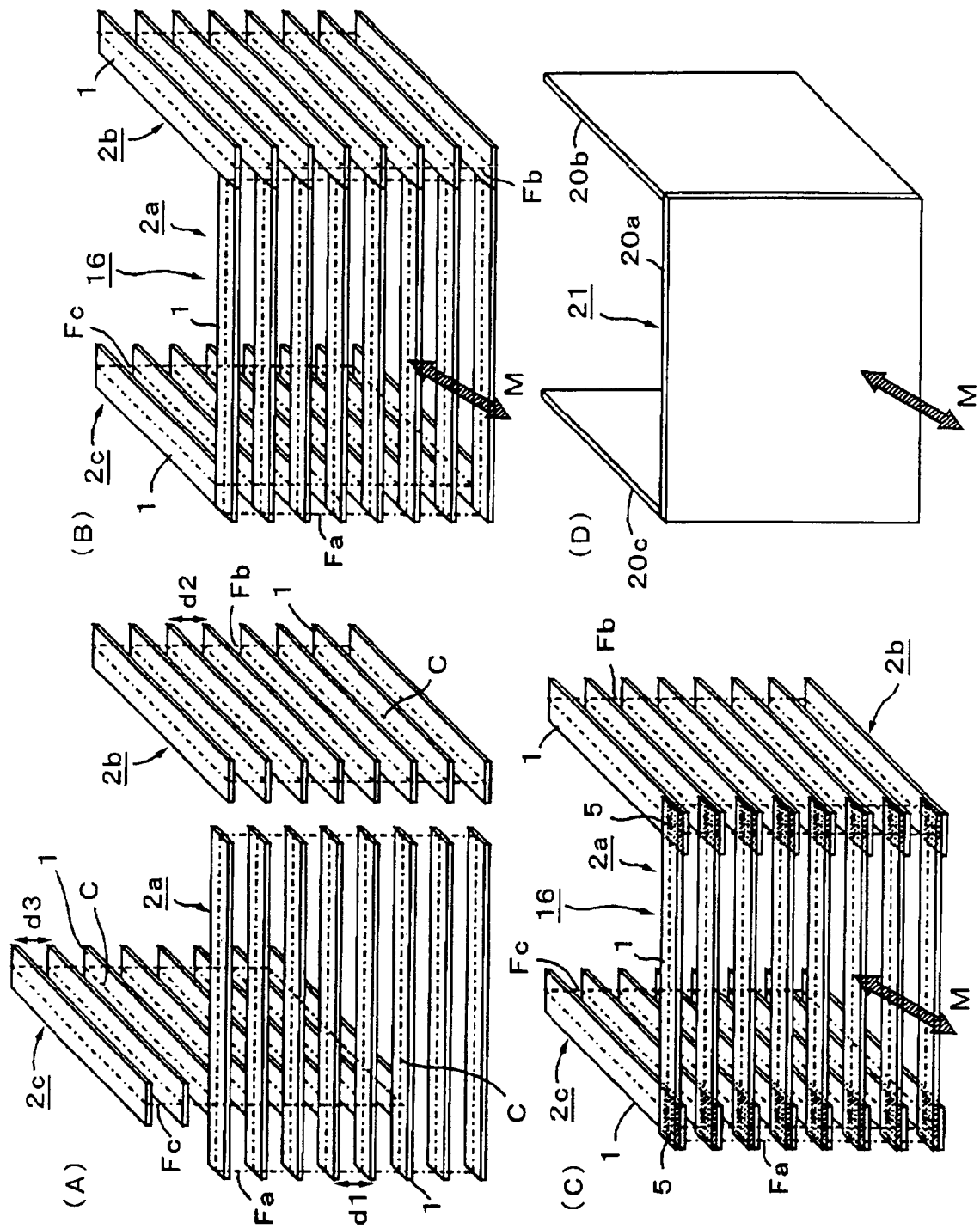
FIG. 1 shows schematic perspective views of two embodiments of a lengthways coupled blinds row of the invention and an example of prior art shield structure.
Figure 2:
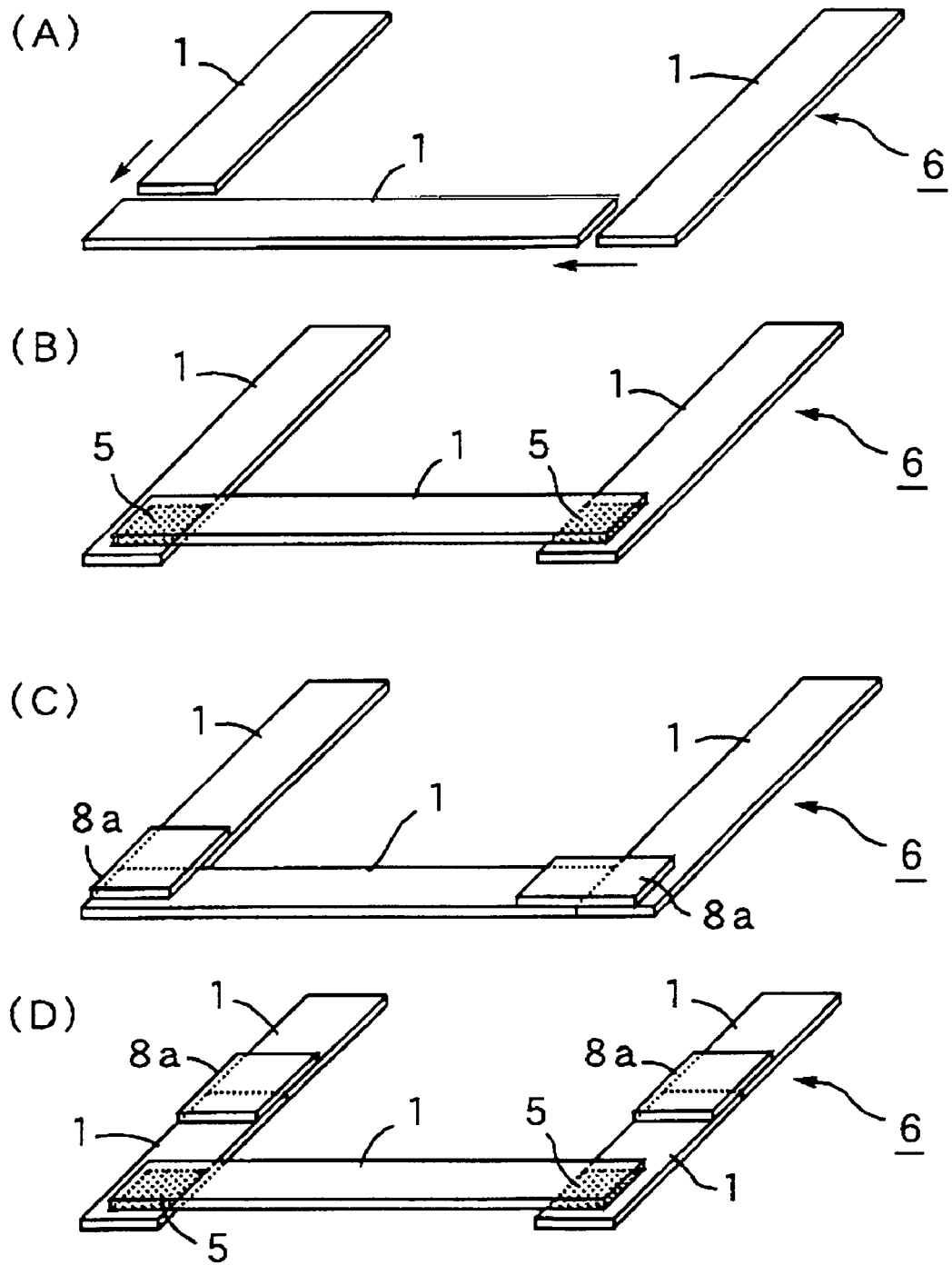
FIG. 2 is a schematic view showing four examples of a magnetic material frame of the invention to be used in shield structures.
Figure 3:
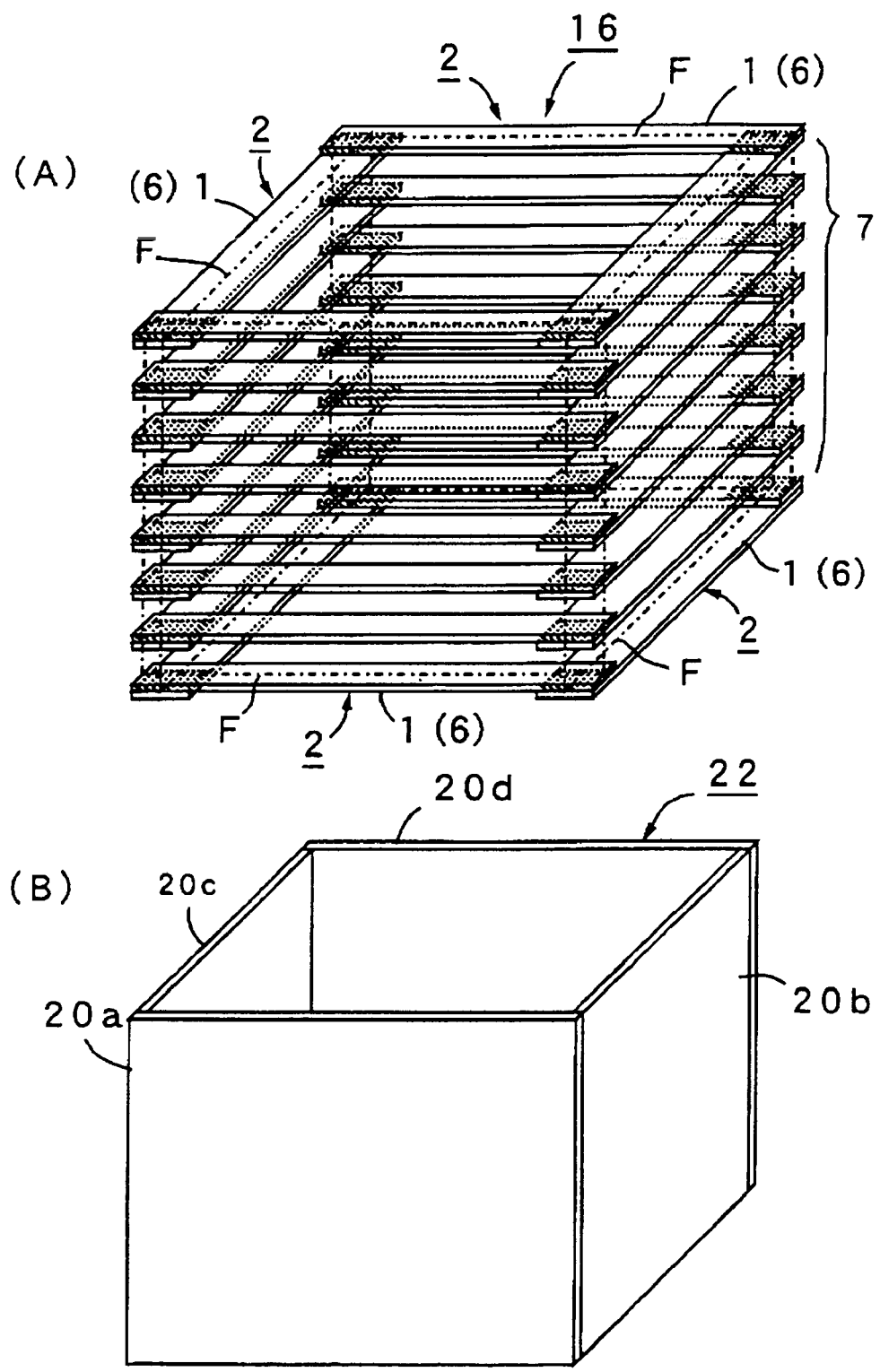
FIG. 3 is a schematic perspective view of an embodiment of the lengthways coupled blinds row which forms a closed magnetic path.
Figure 4:
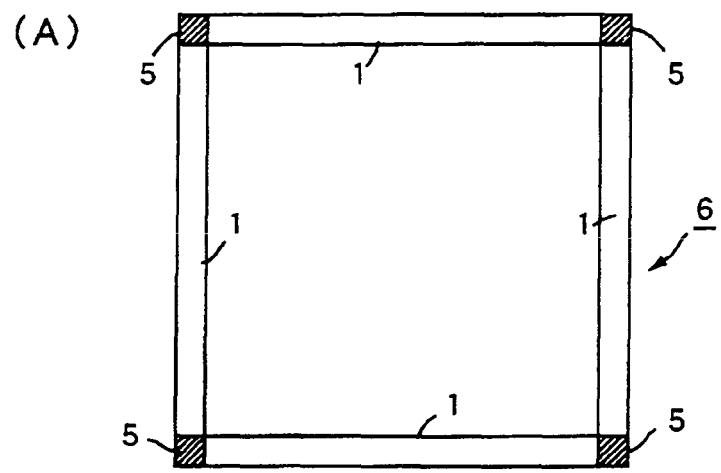
FIG. 4 shows typical magnetic material frames forming closed magnetic paths (annular magnetic material plates)
Figure 4:
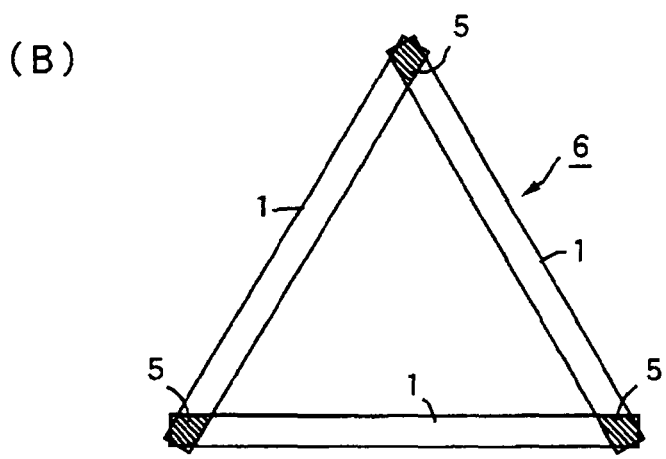
Figure 4:
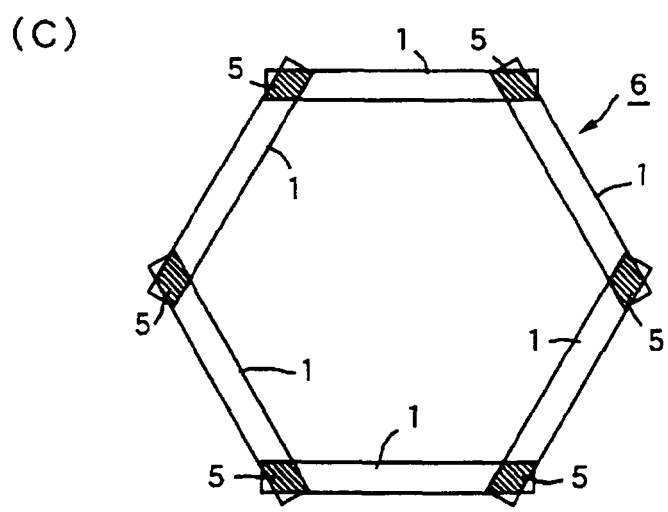
Figure 5:
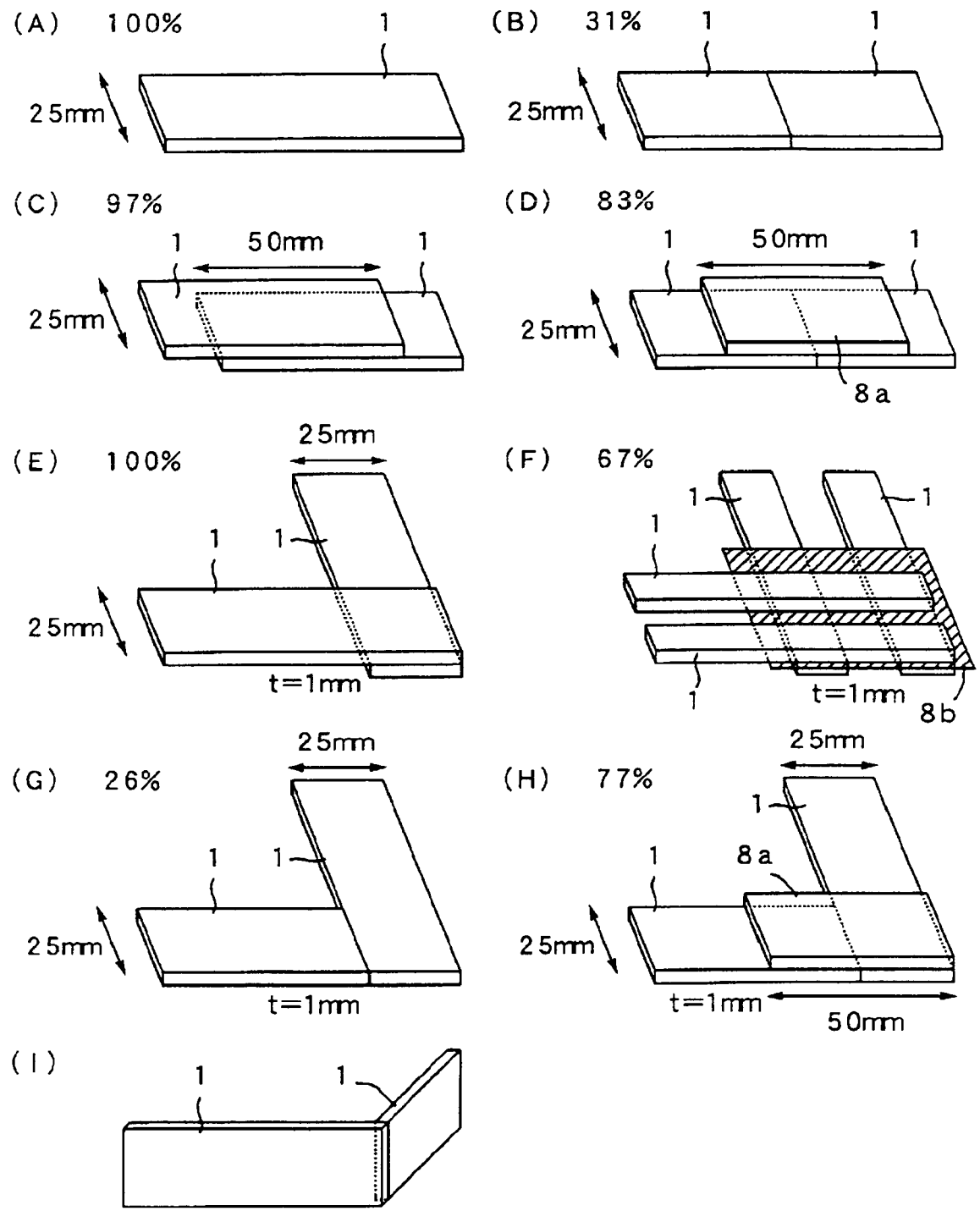
FIG. 5 illustrates different methods for coupling slat terminal portions which result in different shield performance.
Figure 6:
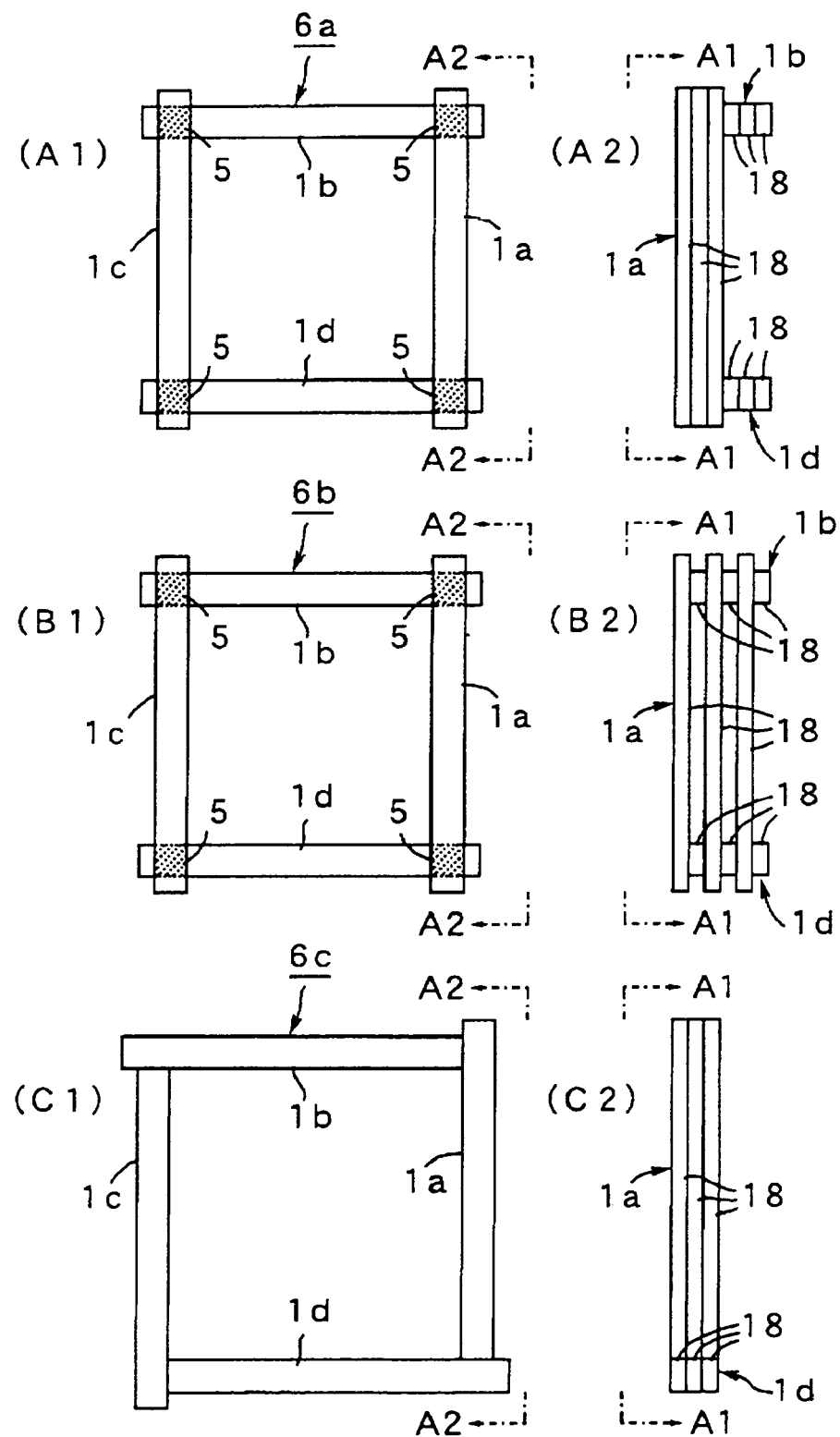
FIG. 6 illustrates three different methods of making a closed magnetic path by coupling four slats.
Figure 7:
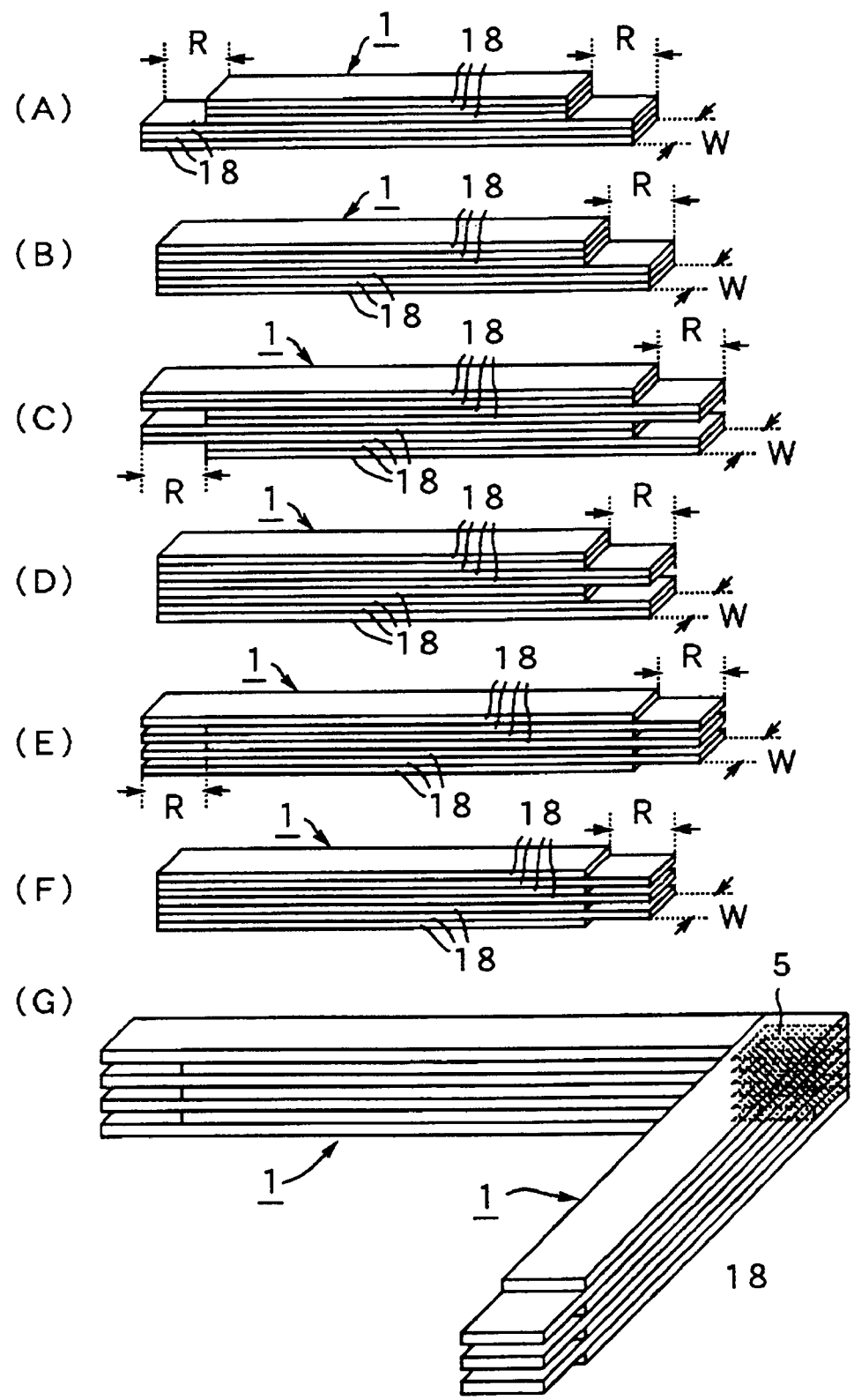
FIG. 7 is a schematic view showing examples of a laminated magnetic material slat of the invention which has protrusions and indents at terminal edge surface.
Figure 8:
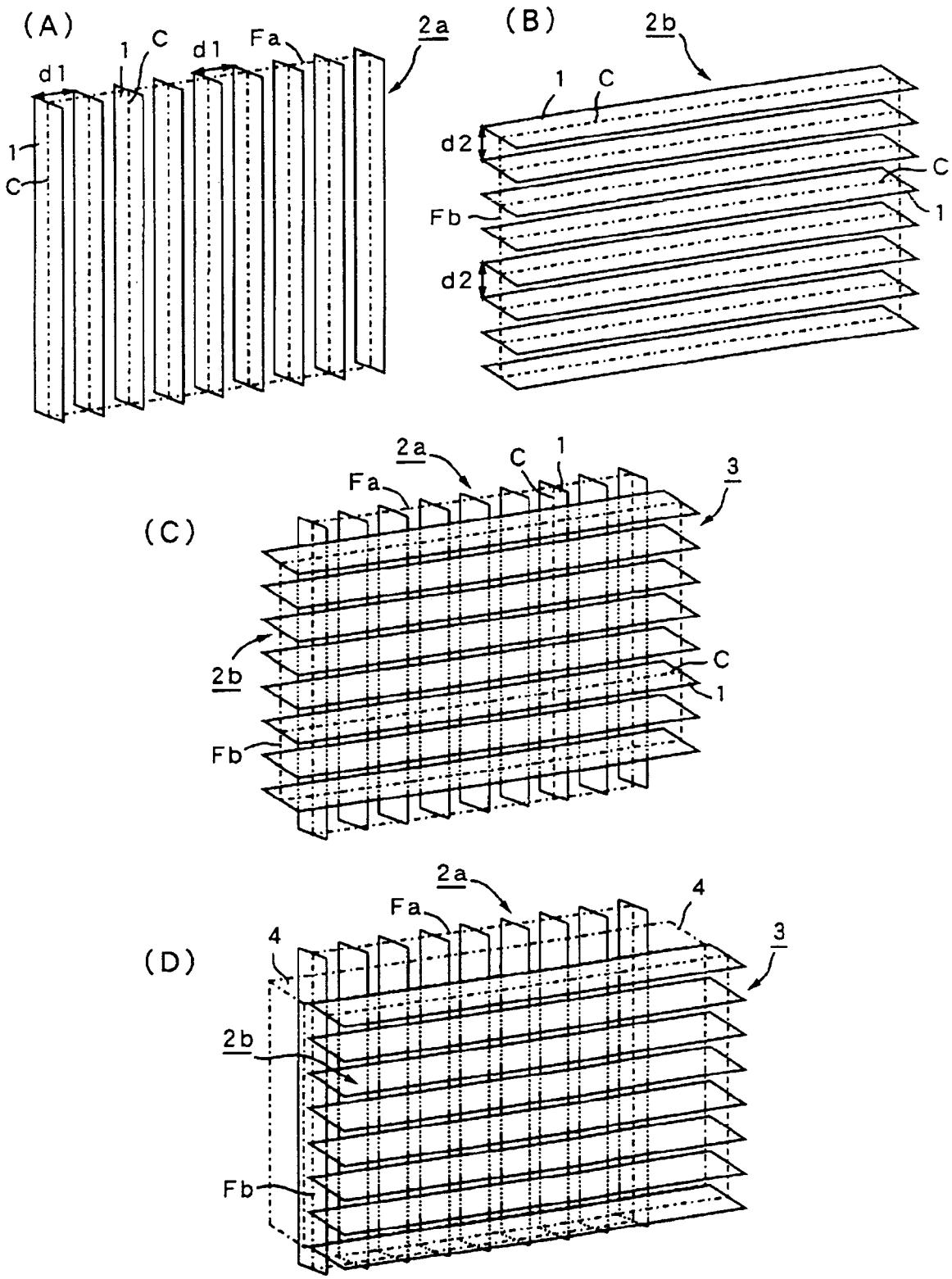
FIG. 8 shows schematic perspective views of embodiments of a sideways stacked blinds unit of the invention.
Figure 9:
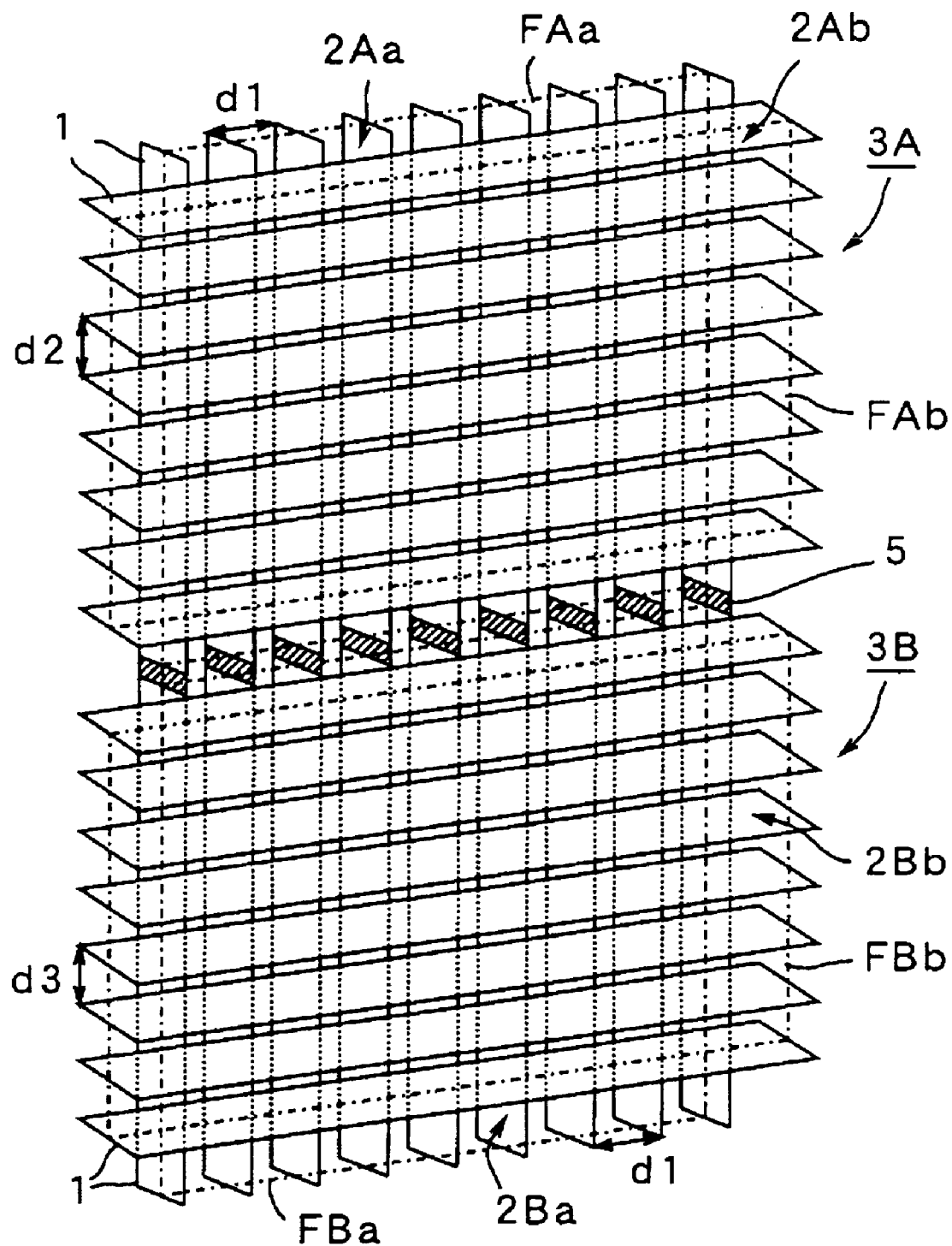
FIG. 9 is a perspective view of two sideways stacked blinds units which are coupled in vertical direction.
Figure 10:
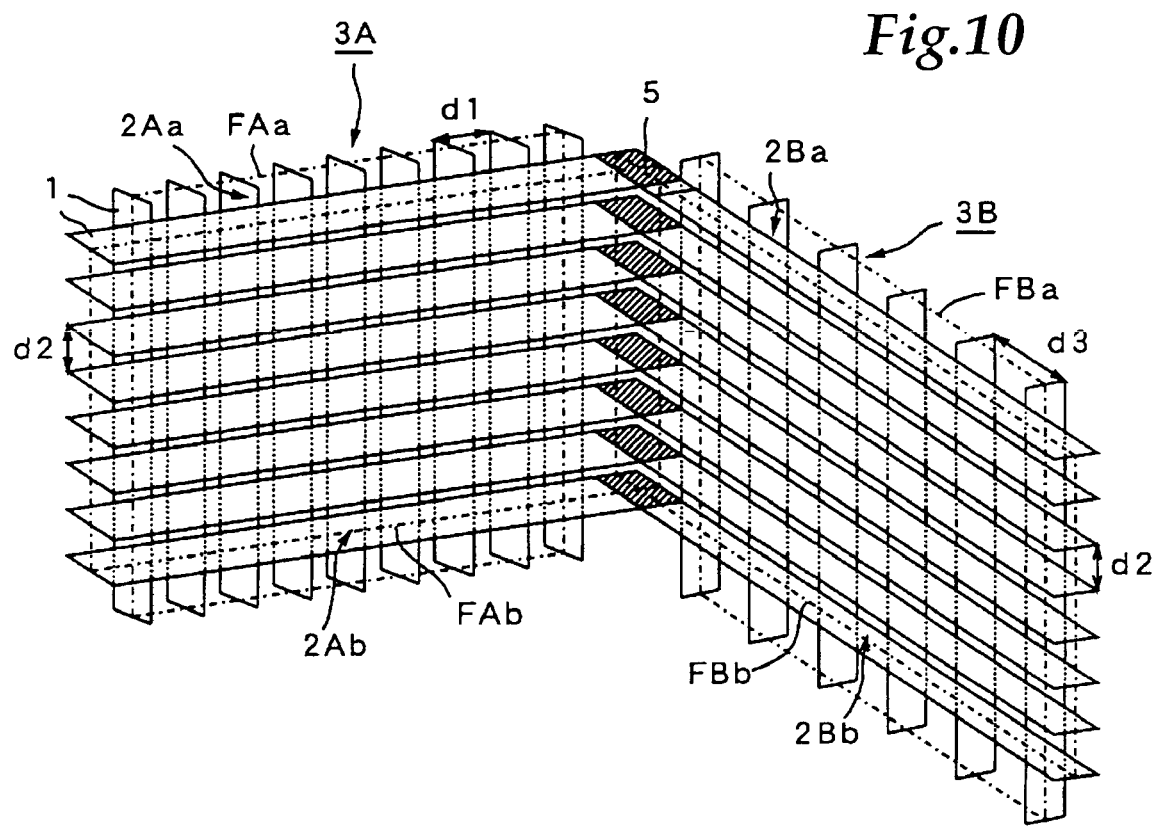
FIG. 10 is a perspective view of two sideways stacked blinds units which are coupled in horizontal direction.
Figure 11:
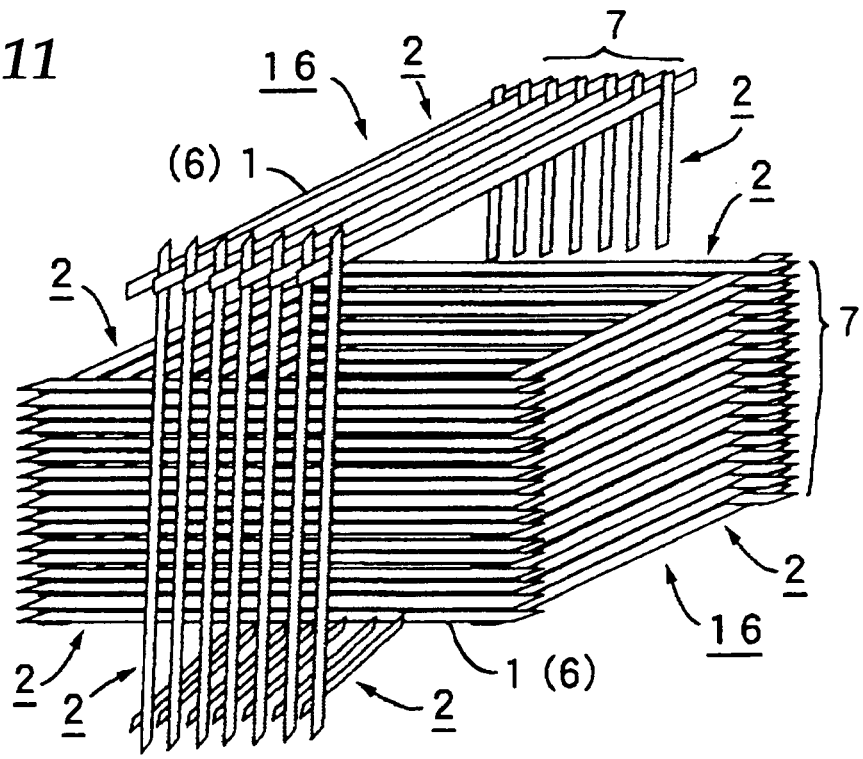
FIG. 11 is a perspective view of an embodiment using two sets of the lengthways coupled blinds row which forms a closed magnetic path.
Figure 12:
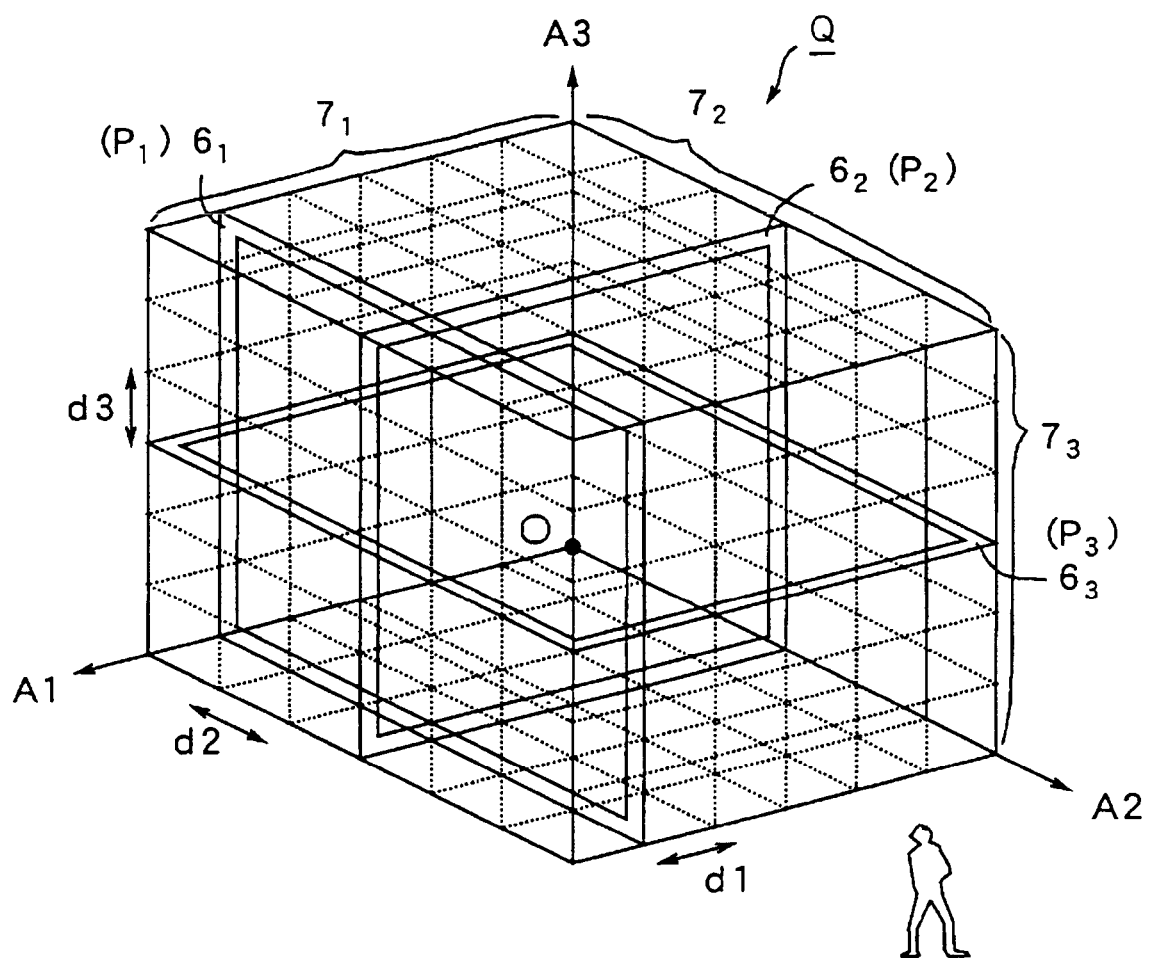
FIG. 12 is a perspective view of basic principles of telescopic type magnetic shield structure using three sets of the lengthways coupled blinds row forming a closed magnetic path.
Figure 13:
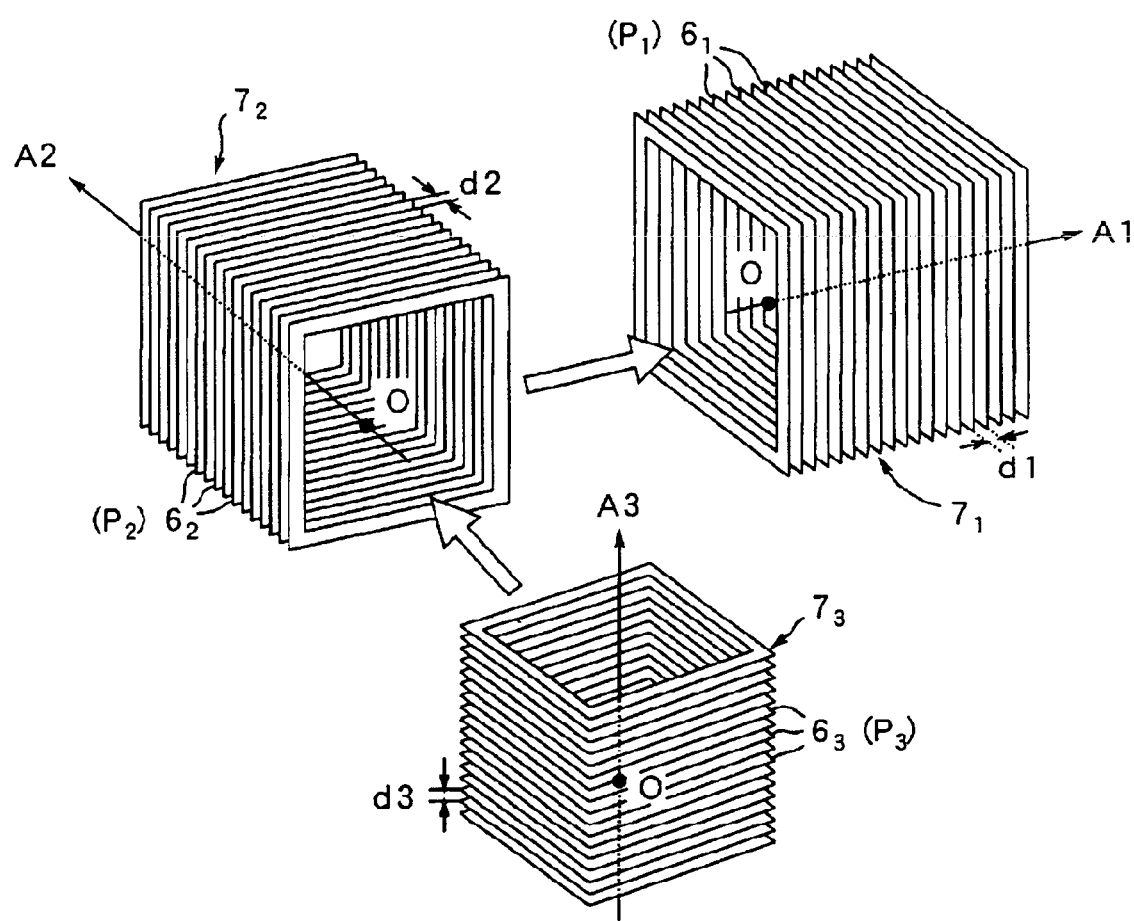
FIG. 13 illustrates a method for building the telescopic type magnetic shield structure of FIG. 12.
Figure 14:
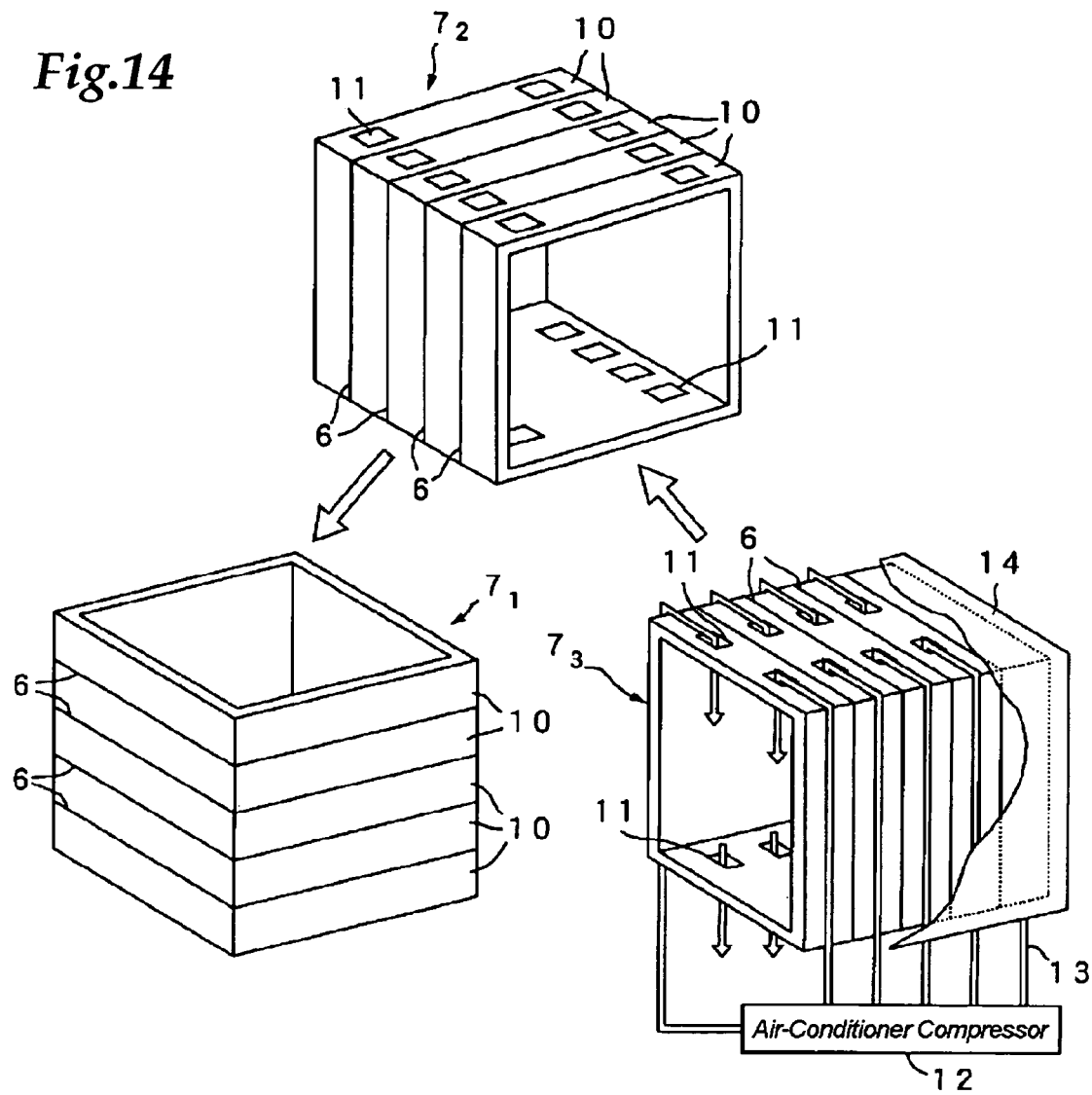
FIG. 14 shows a practical embodiment of the telescopic type magnetic shield structure of FIG. 12.
Figure 15:
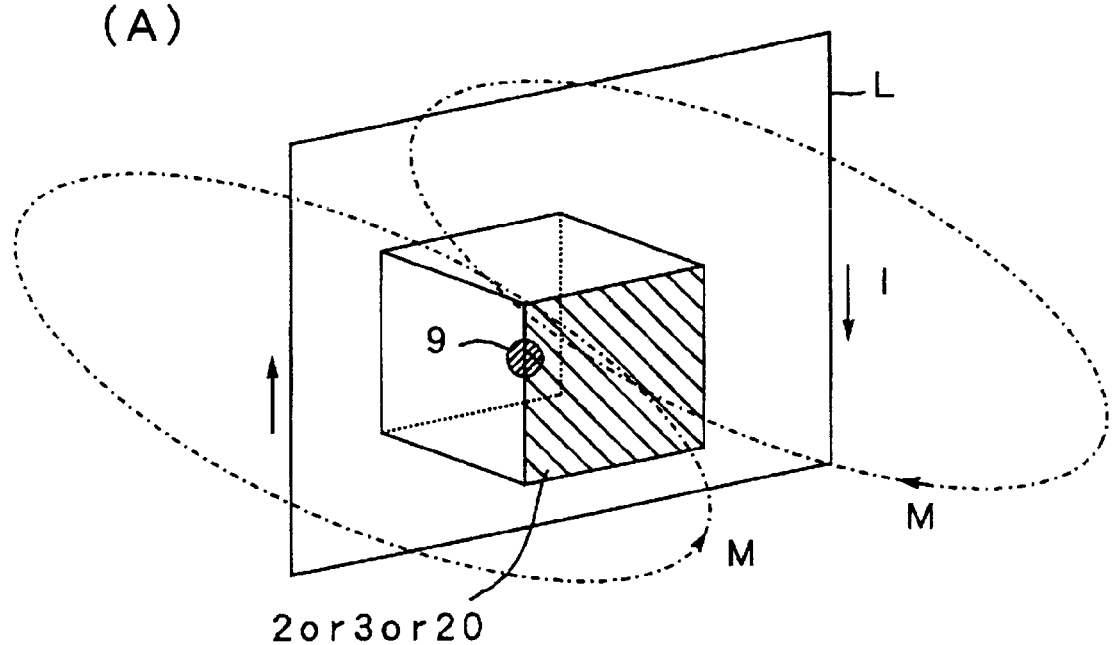
FIG. 15 is a schematic diagram showing a method of measuring shield performance of shield structure.
Figure 15:
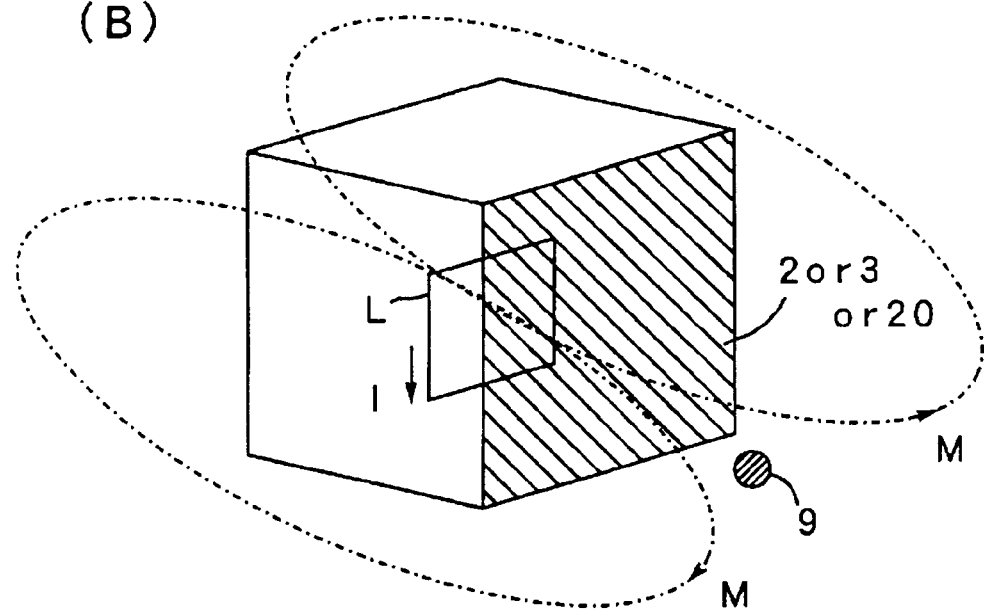
Figure 16:
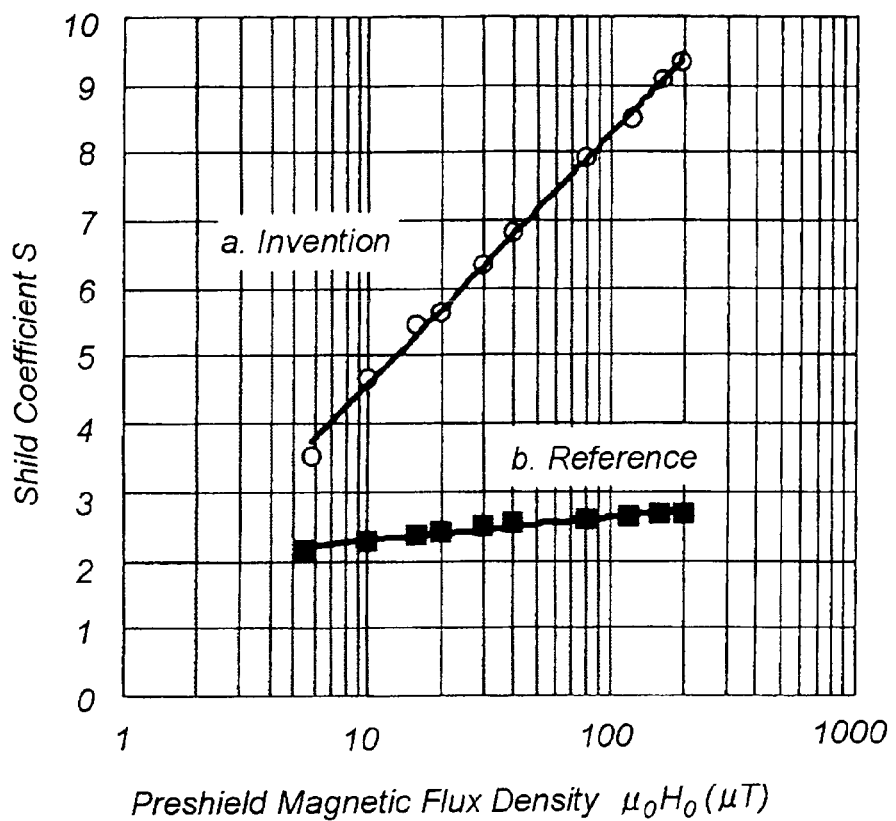
FIG. 16 is a graph showing the shield performance of a lengthways coupled blinds row.
Figure 17:
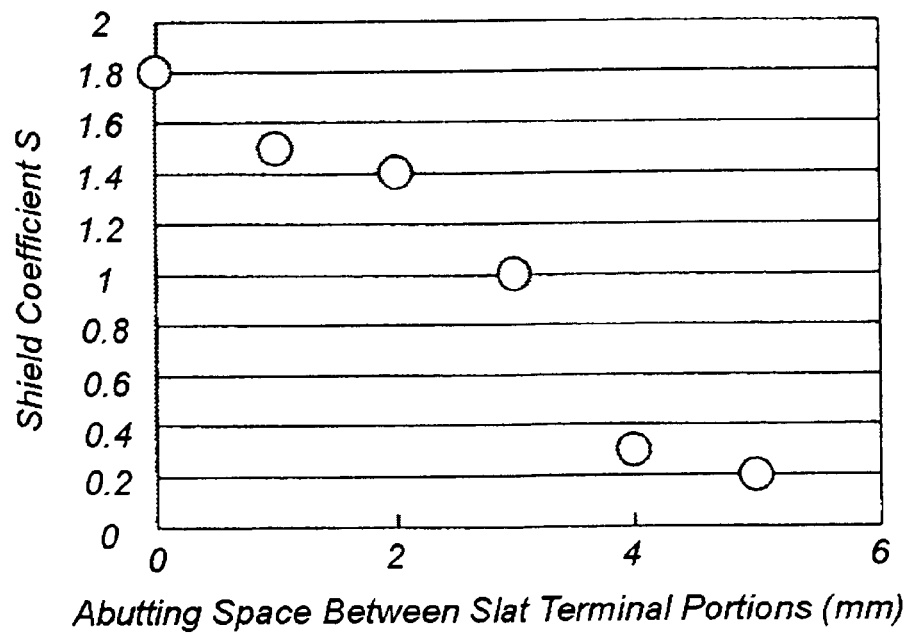
FIG. 17 is a graph showing the relationship between the magnitude of space in abutted slat terminal edges for coupling and shield performance.
Figure 18:
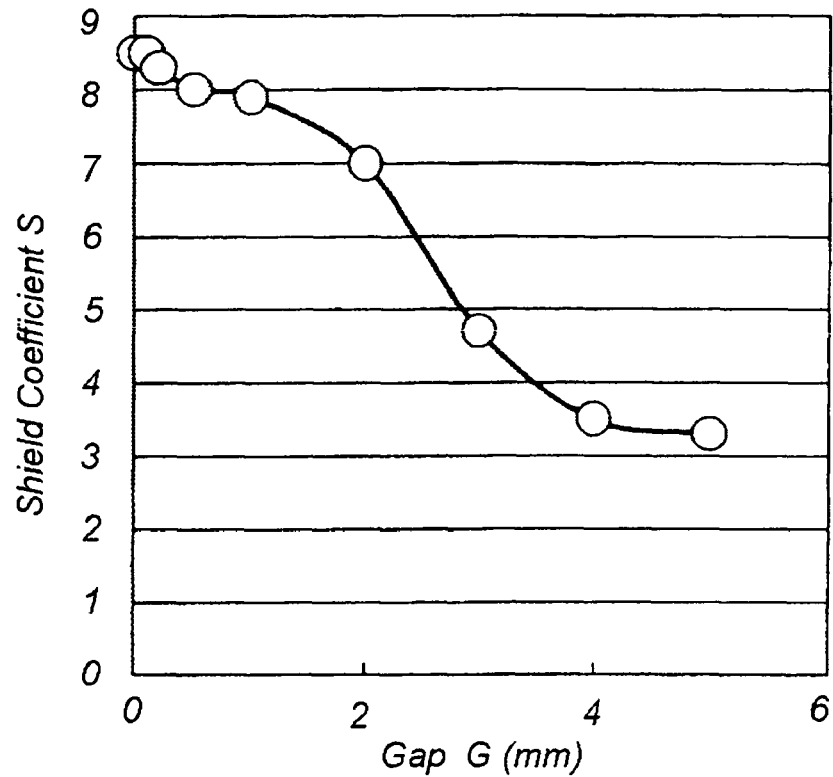
FIG. 18 is a graph showing the relationship between the magnitude of gap G in overlapped slat terminal portions for coupling and shield performance.
Figure 19:
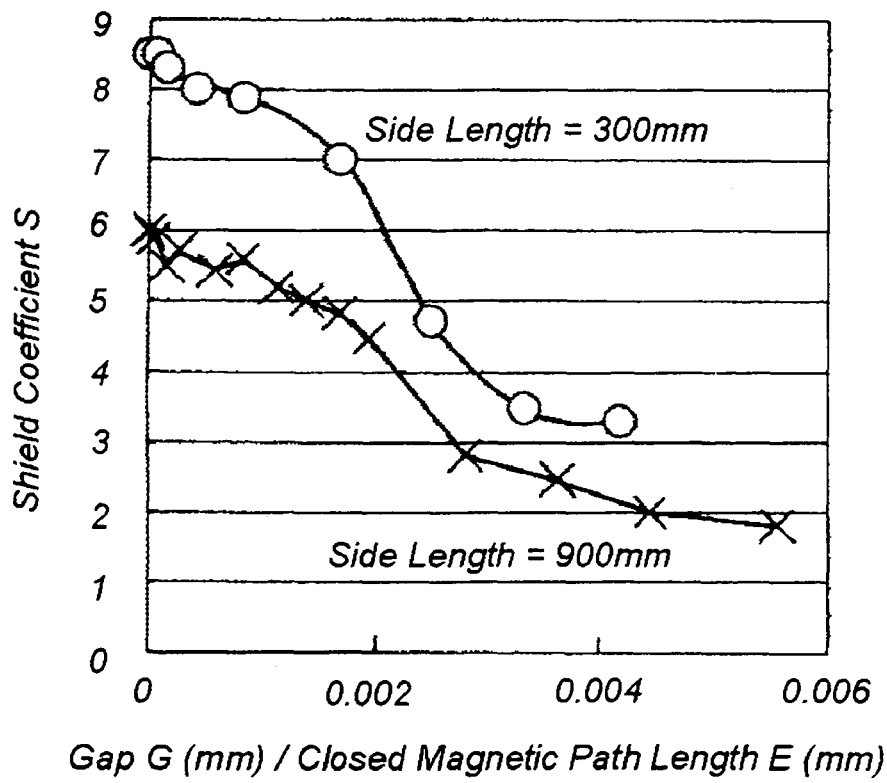
FIG. 19 is a graph showing the relationship between the shield performance of a lengthways coupled row made by overlapping slats and the ratio of the length E of each row made by overlapped slats over gap G in the overlapped slats.
Figure 20:
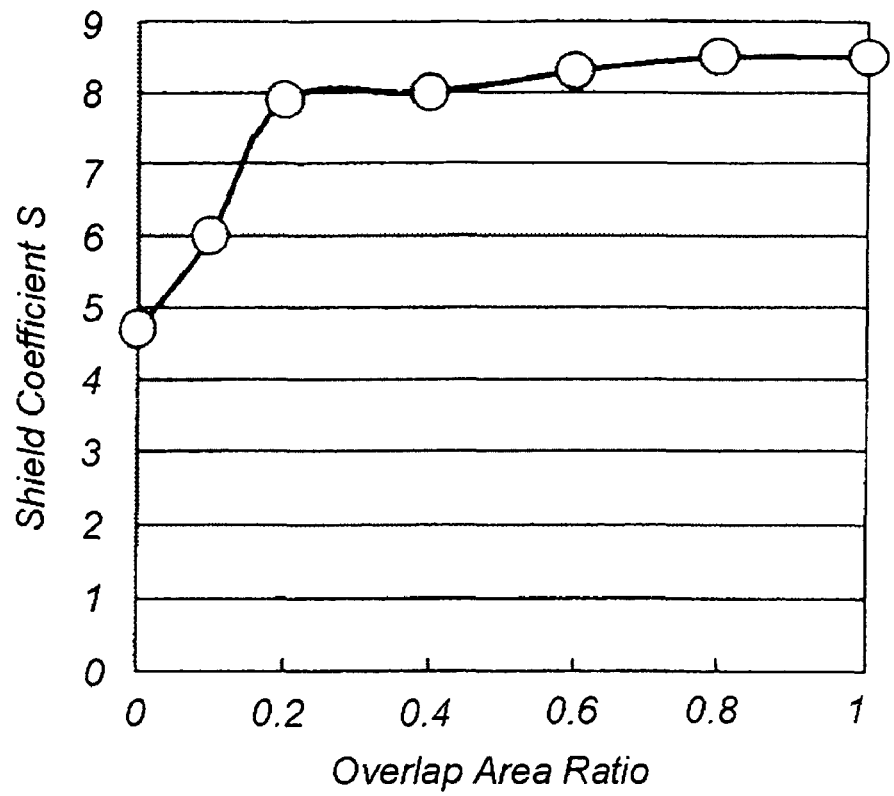
FIG. 20 is a graph showing the relationship between the shield performance of a lengthways coupled blinds row made by overlapping slats and overlap ratio ($\alpha/W^2$, $\alpha$ being overlapped area, W being slap width)
Figure 21:
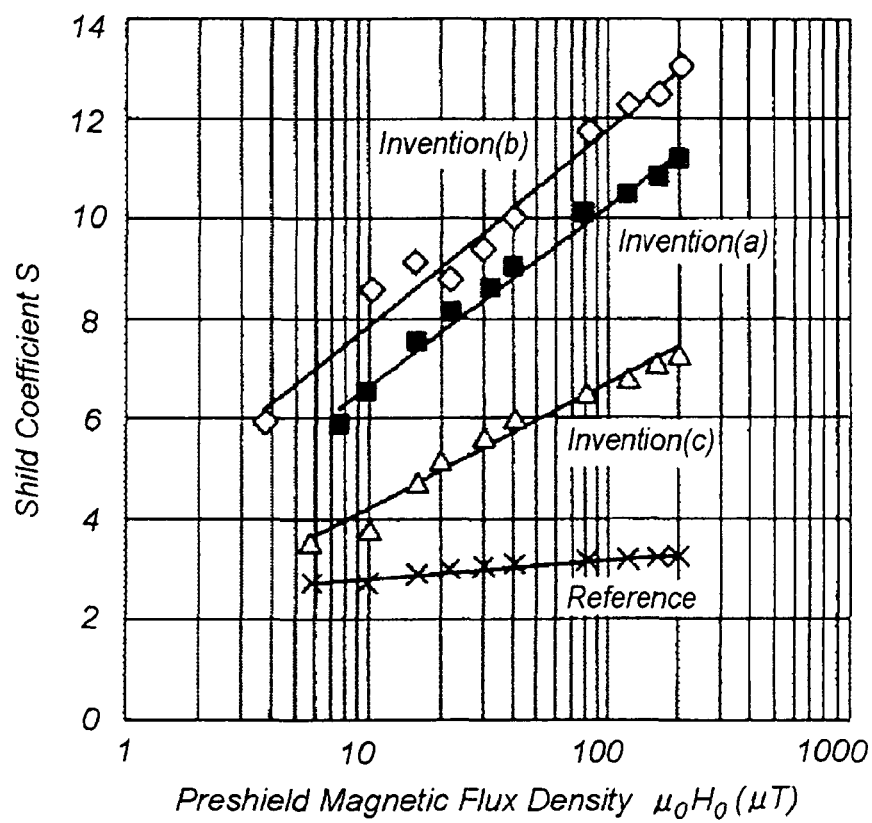
FIG. 21 is a graph showing the shield performance of a lengthways coupled blinds row in which one of coupling the methods of FIG. 6 is used.
Figure 22:
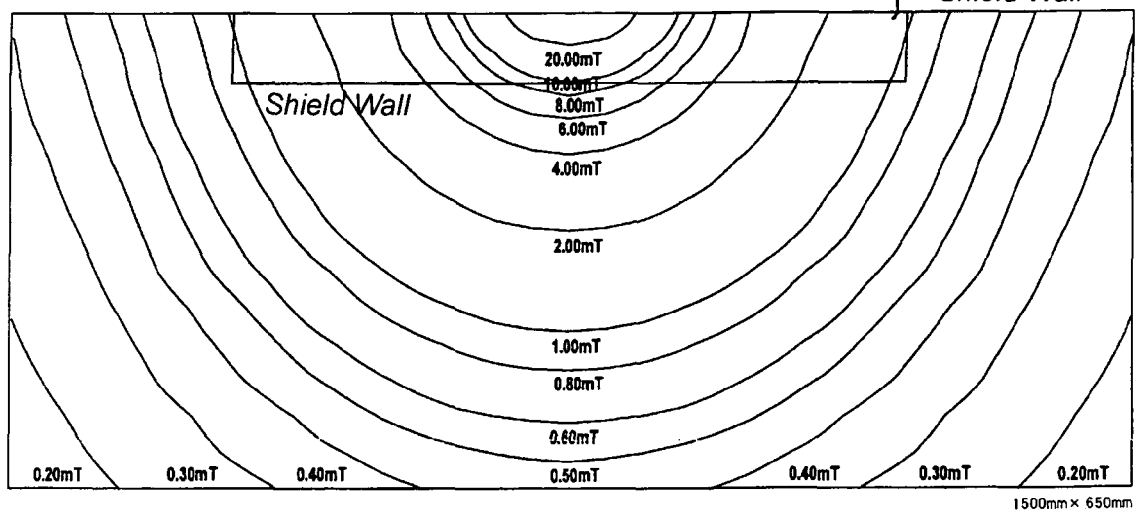
FIG. 22 shows maps illustrating the shield performance of the shield structure of the invention and prior art shield structure.
Figure 22:
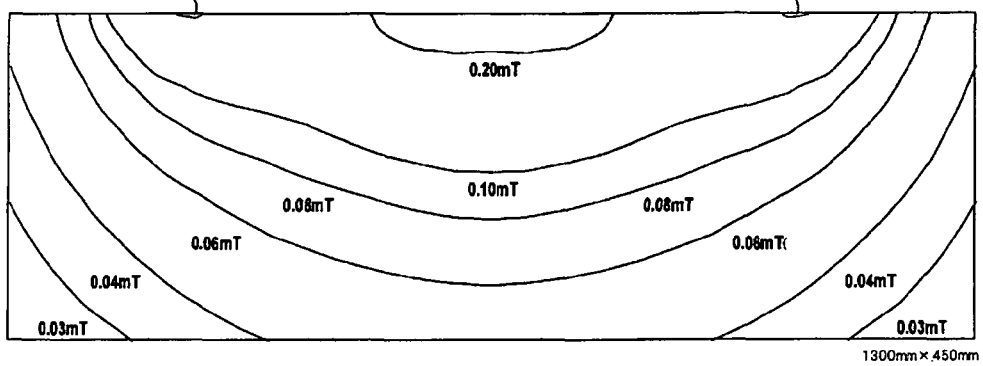
Figure 22:
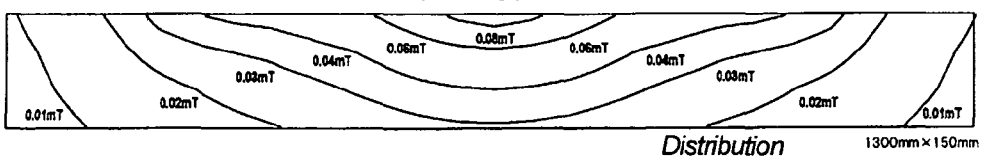
Figure 23:
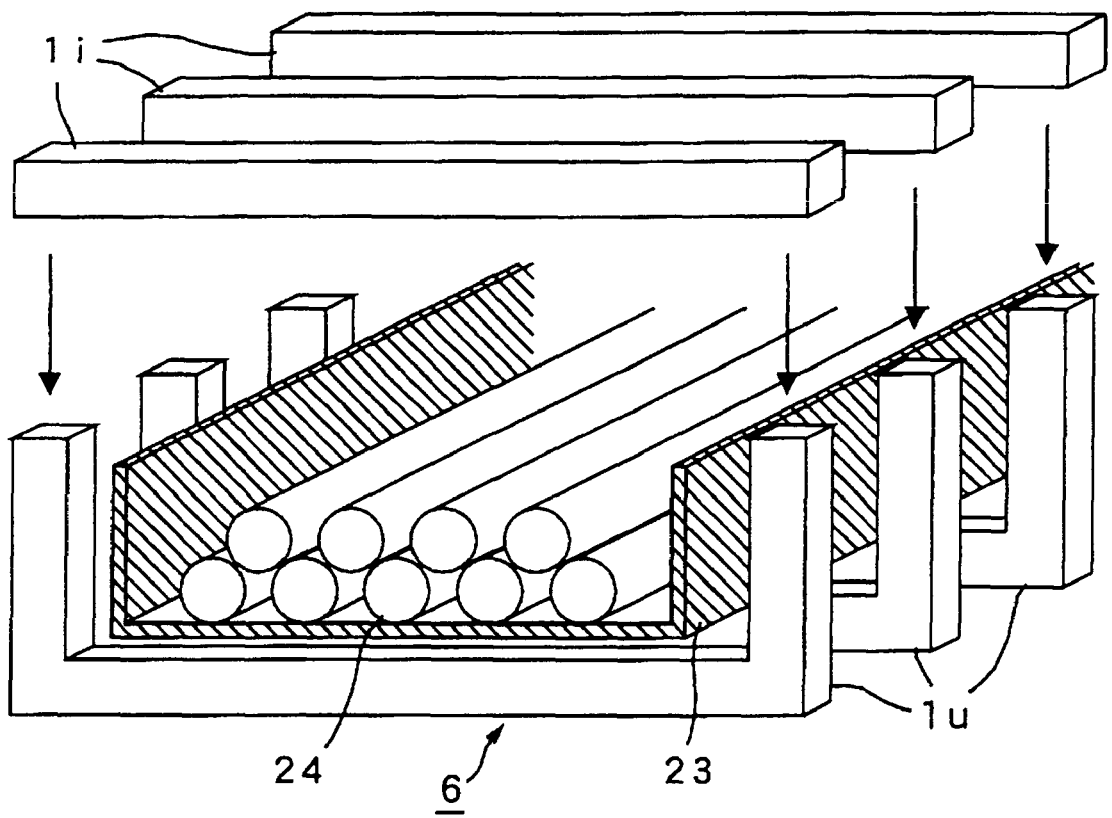
FIG. 23 illustrates an example of magnetic shield cable duct having openings.
Figure 23:
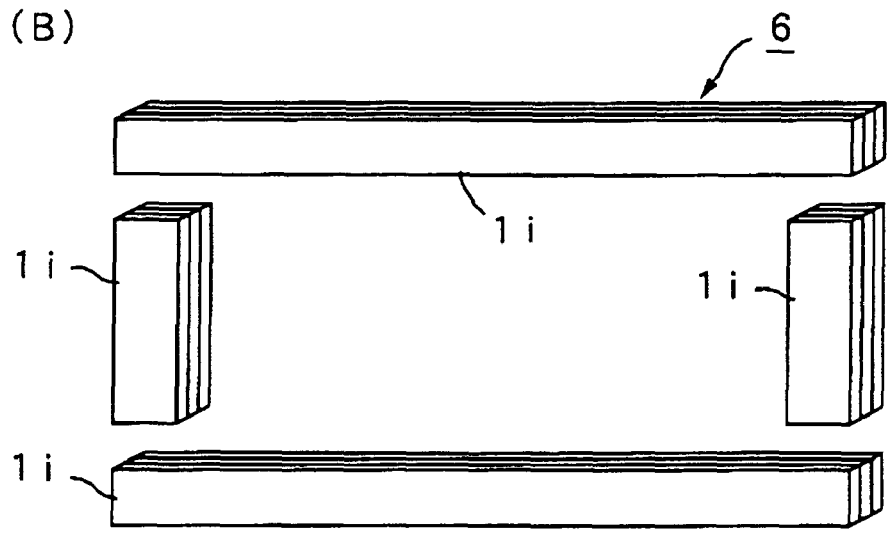

1: magnetic material slat
2: blind body
3: sideways stacked blinds unit
4: air gap layer
5: overlapping portion
6: magnetic material frame 7: set of magnetic material frames
8: magnetic material bridging plate
9: magnetic sensor
10: heat insulation
11: ventilation draught
12: air conditioner
13: air passage
14: wall
16: lengthways coupled blinds row
18: magnetic material thin sheet
20: magnetic material plate (solid shield plate)
21, 22: tightly closed type shield structure (solid shield unit)
23: wire rack
24: electrical wire

The invention claimed is:

1. A magnetic shield structure having openings, the structure comprising a first set of annular magnetic material plates surrounding a first axis passing center of a space being shielded and lying on such spaced parallel planes crossing the fist axis as required for magnetic shielding, respectively, periphery of each first set annular plates defining that of cross section of the space; and a second set of annular magnetic material plates surrounding a second axis passing the center of the space and lying on such spaced parallel planes crossing the second axis as required for magnetic shielding, respectively, periphery of each second set annular plates being smaller than that of the first set annular magnetic material plates, whereby the space being shielded is surrounded by two sets of annular magnetic material plates and spaces between adjacent annular magnetic material plates form openings in the magnetic shield structure.

2. A magnetic shield structure according to claim 1, wherein said first axis and said second axis cross each other.

3. A magnetic shield structure according to claim 1, wherein said magnetic shield structure further comprises an air gap layer between said first and said second sets of annular magnetic material plates.

4. A magnetic shield structure according to claim 1, wherein said magnetic shield structure further comprises up to $n^{th}$ (n being a natural number larger than 2) set of annular magnetic material plates surrounding an $n^{th}$ axis passing the center of the space being shielded and lying on such spaced parallel planes crossing the $n^{th}$ axis as required for magnetic shielding, respectively, periphery of each $n^{th}$ set annular magnetic material plates being smaller than that of $(n-1)^{th}$ set annular magnetic material plates, whereby the space being shielded is surrounded by n sets of annular magnetic material plates.

5. A magnetic shield structure according to claim 4, wherein said $n^{th}$ axis and said $(n-1)^{th}$ axis cross each other.

6. A magnetic shield structure according to claim 4 or 5, wherein an air gap layer is inserted between said $n^{th}$ and said $(n-1)^{th}$ sets of annular magnetic material plates.

7. A magnetic shield structure according to claim 1 or 4, wherein each said annular magnetic material plate is made by a plurality of magnetic material slats serially coupled in an annular form through overlapping or abutting of terminal portions of adjacent slats.

8. A magnetic shield structure according to claim 1 or 4, wherein the magnetic material slat or plate is made by using one or more materials selected from the group consisting of grain-oriented electrical steel sheets, non-oriented electrical steel sheets, Permalloy, soft magnetic steel sheets, amorphous alloy, and nanocrystalline materials crystallized from liquid-quenched thin strips.

9. A magnetic shield structure according to claim 8, wherein the magnetic blind body includes magnetic material slats made of different materials.

* * * * *